United States Patent
Wei et al.

(10) Patent No.: US 9,345,149 B2
(45) Date of Patent: May 17, 2016

(54) METHODS OF TREATING COPPER SURFACES FOR ENHANCING ADHESION TO ORGANIC SUBSTRATES FOR USE IN PRINTED CIRCUIT BOARDS

(75) Inventors: Jen-Chieh Wei, Highlands Ranch, CO (US); Zhiming Liu, Englewood, CO (US); Steven Z. Shi, Highlands Ranch, CO (US); Werner G. Kuhr, Denver, CO (US)

(73) Assignee: eSionic Corp., Menlo Park, CA (US)

( * ) Notice: Subject to any disclaimer, the term of this patent is extended or adjusted under 35 U.S.C. 154(b) by 542 days.

(21) Appl. No.: 13/142,588

(22) PCT Filed: Jul. 6, 2010

(86) PCT No.: PCT/US2010/041091
§ 371 (c)(1),
(2), (4) Date: Feb. 7, 2012

(87) PCT Pub. No.: WO2012/005723
PCT Pub. Date: Jan. 12, 2012

(65) Prior Publication Data
US 2012/0125514 A1 May 24, 2012

(51) Int. Cl.
*B32B 38/08* (2006.01)
*B05D 5/12* (2006.01)
(Continued)

(52) U.S. Cl.
CPC ............... *H05K 3/385* (2013.01); *H05K 3/389* (2013.01); *H05K 3/4652* (2013.01); *H05K 2203/1157* (2013.01); *Y10T 156/10* (2015.01)

(58) Field of Classification Search
CPC .......... B32B 37/14; B32B 38/08; B05D 5/12; B05D 3/10
USPC ........................................... 156/60
See application file for complete search history.

(56) References Cited

U.S. PATENT DOCUMENTS 2,364,993 A 12/1944 Meyer
2,460,896 A 2/1949 Meyer
(Continued)

FOREIGN PATENT DOCUMENTS

CN 103120037 5/2013
EP 0 552 830 A1 7/1993
(Continued)

OTHER PUBLICATIONS

Asakura, S. et al., "Fabrication of Built-In Copper Microstructures on Epoxy Resin," Microelectronic Engineering, vol. 75, Issue 4, Nov. 2004, pp. 375-382.
(Continued)

*Primary Examiner* — Daniel Lee
(74) *Attorney, Agent, or Firm* — Nixon Peabody LLP

(57) ABSTRACT

Embodiments of the present invention relates generally to the manufacture of printed circuit boards (PCB's) or printed wiring boards (PWB's), and particularly to methods for treating smooth copper surfaces to increase the adhesion between a copper surface and an organic substrate. More particularly, embodiments of the present invention related to methods of achieving improved bonding strength of PCBs without roughening the topography of the copper surface. The bonding interface between the treated copper and the resin layer of the PCB exhibits excellent resistance to heat, moisture, and chemicals involved in post-lamination process steps.

22 Claims, 17 Drawing Sheets

(51) Int. Cl.
*B32B 37/14* (2006.01)
*B05D 3/10* (2006.01)
*H05K 3/38* (2006.01)
*H05K 3/46* (2006.01)

(56) References Cited

U.S. PATENT DOCUMENTS

| | | |
|---|---|---|
| 2,460,898 A | 2/1949 | Meyer |
| 2,955,974 A | 10/1960 | Allen et al. |
| 3,011,920 A | 12/1961 | Shipley, Jr. |
| 3,177,103 A | 4/1965 | Tally et al. |
| 3,198,672 A | 8/1965 | Hart |
| 3,240,662 A | 3/1966 | Smyers et al. |
| 3,374,129 A | 3/1968 | Gerald |
| 3,434,889 A | 3/1969 | Haroldson et al. |
| 3,481,777 A | 12/1969 | Spannhake |
| 3,532,518 A | 10/1970 | D'Ottavio et al. |
| 3,544,389 A | 12/1970 | Vazirani |
| 3,677,828 A | 7/1972 | Caule et al. |
| 3,770,598 A | 11/1973 | Creutz |
| 3,833,433 A | 9/1974 | Caule |
| 3,876,513 A | 4/1975 | Brown et al. |
| 4,073,740 A | 2/1978 | Polichette et al. |
| 4,089,686 A | 5/1978 | Townsend |
| 4,152,477 A | 5/1979 | Haruta et al. |
| 4,374,709 A | 2/1983 | Combs |
| 4,376,685 A | 3/1983 | Watson |
| 4,409,037 A | 10/1983 | Landau |
| 4,446,176 A | 5/1984 | Close |
| 4,448,804 A | 5/1984 | Amelio et al. |
| 4,478,883 A | 10/1984 | Bupp et al. |
| 4,512,818 A | 4/1985 | Valayil et al. |
| 4,515,829 A | 5/1985 | Deckart et al. |
| 4,554,182 A | 11/1985 | Bupp et al. |
| 4,555,315 A | 11/1985 | Barbieri et al. |
| 4,592,852 A | 6/1986 | Courduvelis et al. |
| 4,608,275 A | 8/1986 | Kukanskis et al. |
| 4,634,468 A | 1/1987 | Gulla et al. |
| 4,642,161 A | 2/1987 | Akahoshi et al. |
| 4,673,459 A | 6/1987 | Elmore et al. |
| 4,702,793 A | 10/1987 | Garlough et al. |
| 4,717,439 A | 1/1988 | Hajdu et al. |
| 4,775,444 A | 10/1988 | Cordani |
| 4,803,097 A | 2/1989 | Fraenkel et al. |
| 4,810,333 A | 3/1989 | Gulla et al. |
| 4,844,981 A | 7/1989 | Landau |
| 4,904,506 A | 2/1990 | Burnett et al. |
| 4,919,768 A | 4/1990 | Bladon |
| 4,948,707 A | 8/1990 | Johnson et al. |
| 4,976,990 A | 12/1990 | Bach et al. |
| 5,006,200 A | 4/1991 | Chen |
| 5,015,339 A | 5/1991 | Pendleton |
| 5,051,154 A | 9/1991 | Bernards et al. |
| 5,068,013 A | 11/1991 | Bernards et al. |
| 5,174,886 A | 12/1992 | King et al. |
| 5,207,888 A | 5/1993 | Bladon |
| 5,227,013 A | 7/1993 | Kumar |
| 5,268,088 A | 12/1993 | Okabayashi |
| 5,318,803 A | 6/1994 | Bickford et al. |
| 5,342,501 A | 8/1994 | Okabayashi |
| 5,342,654 A | 8/1994 | Koizumi et al. |
| 5,389,496 A | 2/1995 | Calvert et al. |
| 5,425,873 A | 6/1995 | Bladon et al. |
| 5,455,072 A | 10/1995 | Bension et al. |
| 5,492,595 A | 2/1996 | Carano et al. |
| 5,532,094 A | 7/1996 | Arimura et al. |
| 5,648,125 A | 7/1997 | Cane |
| 5,700,389 A | 12/1997 | Nakagawa |
| 5,721,014 A * | 2/1998 | Fakler et al. ............... 427/299 |
| 5,736,065 A | 4/1998 | Nakaso et al. |
| 5,745,984 A | 5/1998 | Cole et al. |
| 5,750,087 A | 5/1998 | Corella, II |
| 5,753,309 A | 5/1998 | Fakler |
| 5,800,859 A | 9/1998 | Price et al. |
| 5,807,493 A | 9/1998 | Maki et al. |
| 5,861,076 A | 1/1999 | Adlam et al. |
| 5,869,130 A | 2/1999 | Ferrier |
| 5,885,476 A | 3/1999 | Hong et al. |
| 5,965,036 A | 10/1999 | Maki et al. |
| 5,985,785 A | 11/1999 | Lane et al. |
| 6,208,553 B1 | 3/2001 | Gryko et al. |
| 6,212,093 B1 | 4/2001 | Lindsey |
| 6,221,653 B1 | 4/2001 | Caren et al. |
| 6,272,038 B1 | 8/2001 | Clausen et al. |
| 6,284,317 B1 | 9/2001 | Laibinis et al. |
| 6,324,091 B1 | 11/2001 | Gryko et al. |
| 6,330,108 B1 | 12/2001 | Nishikouji et al. |
| 6,381,169 B1 | 4/2002 | Bocian et al. |
| 6,426,020 B1 | 7/2002 | Okada et al. |
| 6,451,942 B1 | 9/2002 | Li et al. |
| 6,554,948 B1 * | 4/2003 | Ferrier ............... 156/326 |
| 6,593,656 B2 * | 7/2003 | Ahn et al. ............... 257/762 |
| 6,642,376 B2 | 11/2003 | Lindsey et al. |
| 6,657,884 B2 | 12/2003 | Bocian et al. |
| 6,674,121 B2 | 1/2004 | Misra et al. |
| 6,716,281 B2 | 4/2004 | Bernards et al. |
| 6,728,129 B2 | 4/2004 | Lindsey et al. |
| 6,746,621 B2 | 6/2004 | Kurii et al. |
| 6,777,516 B2 | 8/2004 | Li et al. |
| 6,828,581 B2 | 12/2004 | Zangmeister et al. |
| 6,919,128 B2 | 7/2005 | McCreery |
| 6,943,054 B2 | 9/2005 | Bocian et al. |
| 6,946,027 B2 | 9/2005 | Bernards et al. |
| 7,025,716 B1 | 4/2006 | Meloul et al. |
| 7,026,051 B2 | 4/2006 | Schauer et al. |
| 7,026,716 B2 | 4/2006 | Ramanath et al. |
| 7,061,791 B2 | 6/2006 | Bocian et al. |
| 7,101,591 B2 | 9/2006 | Hayashi et al. |
| 7,108,795 B2 | 9/2006 | Bernards et al. |
| 7,141,299 B2 * | 11/2006 | McCreery ............... 428/333 |
| 7,182,821 B2 | 2/2007 | Izumi et al. |
| 7,211,204 B2 | 5/2007 | Bernards et al. |
| 7,217,769 B2 | 5/2007 | Zamora et al. |
| 7,223,628 B2 | 5/2007 | Bocian et al. |
| 7,332,599 B2 | 2/2008 | Yu et al. |
| 7,351,353 B1 | 4/2008 | Bernards et al. |
| 7,452,572 B1 | 11/2008 | Bocian et al. |
| 8,323,769 B2 | 12/2012 | Kuhr et al. |
| 2001/0026120 A1 | 10/2001 | Fukuyoshi et al. |
| 2002/0076714 A1 | 6/2002 | Kuhr |
| 2002/0154535 A1 | 10/2002 | Bocian et al. |
| 2002/0180446 A1 | 12/2002 | Kuhr et al. |
| 2003/0081463 A1 | 5/2003 | Bocian et al. |
| 2003/0082444 A1 | 5/2003 | Kuhr et al. |
| 2003/0111670 A1 | 6/2003 | Misra et al. |
| 2003/0169618 A1 | 9/2003 | Lindsey et al. |
| 2004/0115524 A1 | 6/2004 | Misra et al. |
| 2004/0120180 A1 | 6/2004 | Rotenberg et al. |
| 2004/0150465 A1 | 8/2004 | Nishida et al. |
| 2004/0161545 A1 | 8/2004 | Montano et al. |
| 2004/0191536 A1 | 9/2004 | Heimann et al. |
| 2004/0231141 A1 | 11/2004 | Nishinaka et al. |
| 2004/0248428 A1 | 12/2004 | Bureau et al. |
| 2005/0041494 A1 | 2/2005 | Bocian et al. |
| 2005/0048691 A1 | 3/2005 | Bocian et al. |
| 2005/0056616 A1 | 3/2005 | Cooper et al. |
| 2005/0062097 A1 | 3/2005 | Misra et al. |
| 2005/0069648 A1 * | 3/2005 | Maruyama ............... 427/379 |
| 2005/0162895 A1 | 7/2005 | Kuhr et al. |
| 2005/0181195 A1 | 8/2005 | Dubrow |
| 2005/0185447 A1 | 8/2005 | Kuhr et al. |
| 2005/0207208 A1 | 9/2005 | Bocian et al. |
| 2005/0243597 A1 | 11/2005 | Gallo et al. |
| 2005/0270820 A1 | 12/2005 | Mobley et al. |
| 2005/0271828 A1 * | 12/2005 | Saito et al. ............... 427/535 |
| 2006/0081950 A1 | 4/2006 | Kuhr et al. |
| 2006/0092687 A1 | 5/2006 | Kuhr et al. |
| 2006/0103018 A1 | 5/2006 | Bureau et al. |
| 2006/0108320 A1 | 5/2006 | Lazovsky et al. |
| 2006/0141156 A1 | 6/2006 | Viel et al. |
| 2006/0195296 A1 | 8/2006 | Petrich et al. |
| 2006/0209587 A1 | 9/2006 | Bocian et al. |
| 2006/0211236 A1 | 9/2006 | Bureau et al. |
| 2006/0267202 A1 * | 11/2006 | Matsuzaki ............... 257/758 |

(56) References Cited

U.S. PATENT DOCUMENTS

| | | | |
|---|---|---|---|
| 2007/0000865 | A1 | 1/2007 | Yoo et al. |
| 2007/0051459 | A1 | 3/2007 | Yamano et al. |
| 2007/0066090 | A1 | 3/2007 | Ono et al. |
| 2007/0108438 | A1 | 5/2007 | Lindsey et al. |
| 2007/0148421 | A1 | 6/2007 | Sohn et al. |
| 2008/0096046 | A1 | 4/2008 | Yamashita et al. |
| 2008/0096470 | A1* | 4/2008 | Hou et al. ............... 451/36 |
| 2008/0131709 | A1* | 6/2008 | Hanson et al. ............ 428/457 |
| 2008/0209876 | A1 | 9/2008 | Miller |
| 2009/0056991 | A1 | 3/2009 | Kuhr et al. |
| 2009/0056994 | A1 | 3/2009 | Kuhr et al. |
| 2010/0075427 | A1 | 3/2010 | Kuhr et al. |

FOREIGN PATENT DOCUMENTS

| | | |
|---|---|---|
| EP | 2591645 | 5/2013 |
| JP | 7-212039 | 8/1995 |
| JP | 2000-96213 A | 4/2000 |
| JP | 2013-534054 A | 8/2013 |
| JP | 2013-232687 A | 11/2013 |
| KR | 10-2013-0052608 A | 5/2013 |
| TW | 201204208 | 1/2012 |
| WO | WO 99/02452 | 1/1999 |
| WO | WO 99/02452 A1 | 1/1999 |
| WO | WO 2004/075248 | 9/2004 |
| WO | WO 2005/086826 | 9/2005 |
| WO | WO 2005/086826 A2 | 9/2005 |
| WO | WO 2009/029863 | 3/2009 |
| WO | WO 2009/029871 | 3/2009 |
| WO | WO 2011/005778 | 1/2011 |
| WO | WO 2012/005723 | 1/2012 |

OTHER PUBLICATIONS

Connelly, N.G. et al., "The Electron-Transfer Reactions for Mononuclear Organotransition Metal Complexes," Advances in Organometallic Chemistry, vol. 23, 1984, pp. 1-93.
Dressick, W. et al., "Covalent Binding of Pd Catalysts to Ligating Self-Assembled Monolayer Films for Selective Electroless Metal Deposition," J. Electrochem Soc., vol. 141, No. 1, Jan. 1994, pp. 210-220.
Gryko, D.T. et al., "Thiol-Derivatized Porphyrins for Attachment to Electroactive Surfaces," J. Org. Chem., vol. 64, Issue 23, 1999, online publication date Oct. 22, 1999, pp. 8635-8647.
Hu, J.C. et al., "Self-Organized Nanomolecular Films on Low-Dielectric Constant Porous Methyl Silsesquioxane at Room Temperature," Journal of The Electrochemical Society, vol. 150, Issue 4, 2003, pp. F61-F66.
Jeon, N. et al., "Patterned Self-Assembled Monolayers Formed by Microcontact Printing Direct Selective Metalization by Chemical Vapor Deposition on Planar and Nonplanar Substrates," Departments of Chemistry, Harvard University, Langmuir, vol. 11, No. 8, 1995, Received May 11, 1995, pp. 3024-3026.
Krishnamoorthy, A. et al., "Self-Assembled Near-Zero Thickness Molecular Layers as Diffusion Barriers for Cu Metallization," Applied Physics Letters, American Institute of Physics, vol. 78, No. 17, Apr. 2001, pp. 2467-2469.
Kuhr, W., "Integration of Molecular Components into Silicon Memory Devices," The Electrochemical Society Interface, Spring 2004, pp. 34-38.

Liu, X. et at., "Enhanced CVD of Copper Films on Self-Assembled Monolayers as Ultrathin Diffusion Barriers," Journal of the Electrochemical Society, vol. 153, Issue 3, 2006, pp. C142-C145.
Murthy, B. R. et al., "Self-Assembled Monolayers as Cu Diffusion Barriers for Ultralow-k Dielectrics," Electrochemical and Solid-State Letters, vol. 9, Issue 7, 2006, pp. F61-F63.
Sawada, S. et al., "Micropatterning of Copper on a Poly(ethylene terephthalate) Substrate Modified with a Self-Assembled Monolayer," American Chemical Society, Langmuir, vol. 22, No. 1, Feb. 2006, pp. 332-337.
Shih, C. H. et al., "Direct Plating of Cu on ALD TaN for 45nm-node Cu Beol Metallization," Taiwan Semiconductor Manufacturing Co., Electron Devices Meeting, Dec. 13-15, 2004, IEDM Technical Digest, IEEE International, pp. 337-340.
Notice of Reasons for Rejection in Japanese Patent Application No. 2013-518360, mailed on Mar. 3, 2014.
Notice of Reasons for Rejection in Japanese Patent Application No. 2013-162185, mailed on Mar. 3, 2014.
International Search Report and Written Opinion in International Application No. PCT/US2008/074887, mailed Nov. 19, 2008.
International Search Report and Written Opinion in International Application No. PCT/US2008/074895, mailed Dec. 4, 2008.
International Search Report and Written Opinion in International Application No. PCT/US2010/041091, mailed Oct. 28, 2010.
International Preliminary Report on Patentability in International Application No. PCT/US2010/041091, mailed Jan. 17, 2013.
Second Notice of Reasons for Rejection in Japanese Patent Application No. 2013-518360, mailed on Oct. 20, 2014.
Second Notice of Reasons for Rejection in Japanese Patent Application No. 2013-162185, mailed on Oct. 20, 2014.
International Search Report and Written Opinion in International Application No. PCT/US10/41091, mailed Oct. 28, 2010.
Gassman et al., "(Trifluoromethyl) Cyclopentadienide: A Powerful Electron-Withdrawing Ligand for Transition-Metal Complexes," J. Am. Chem. Soc., vol. 108, 1996, pp. 4228-4229.
Connelly et al., "Chemical Redox Agents for Organometallic Chemistry," Chem. Rev., vol. 96, 1996, pp. 877-910.
Geiger et al., "The Electron-Transfer Reactions of Polynuclear Organotransition Metal Complexes," Advances in Organometallic Chemistry, vol. 24, 1985, pp. 87-130.
Ng et al., "Sandwich-type Heteroleptic Phthalocyaninato and Porphyrinato Metal Complexes," Chem. Society Reviews, vol. 26, 1997, pp. 433-442.
Robbins et al., "Syntheses and Electronic Structures of Decamethylmetallocenes," J. Am. Chem. Soc., vol. 104, 1982, pp. 1882-1893.
Partial Supplementary European Search Report in European Application No. 10854525.2, dated Apr. 30, 2015.
Extended European Search Report in European Application No. 10854525.2, dated Sep. 22, 2015.
Notice of Reasons for Rejection in Japanese Patent Application No. 2015-031986, mailed Jan. 8, 2016.
Notice of Reasons for Rejection in Japanese Patent Application No. 2015-031989, mailed on Jan. 8, 2016.
Notice of Reasons for Rejection in Japanese Patent Application No. 2013-162185, mailed on Jan. 18, 2016.
Notice of Reasons for Rejection in Japanese Patent Application No. 2013-518360, mailed on Jan. 18, 2016.

\* cited by examiner

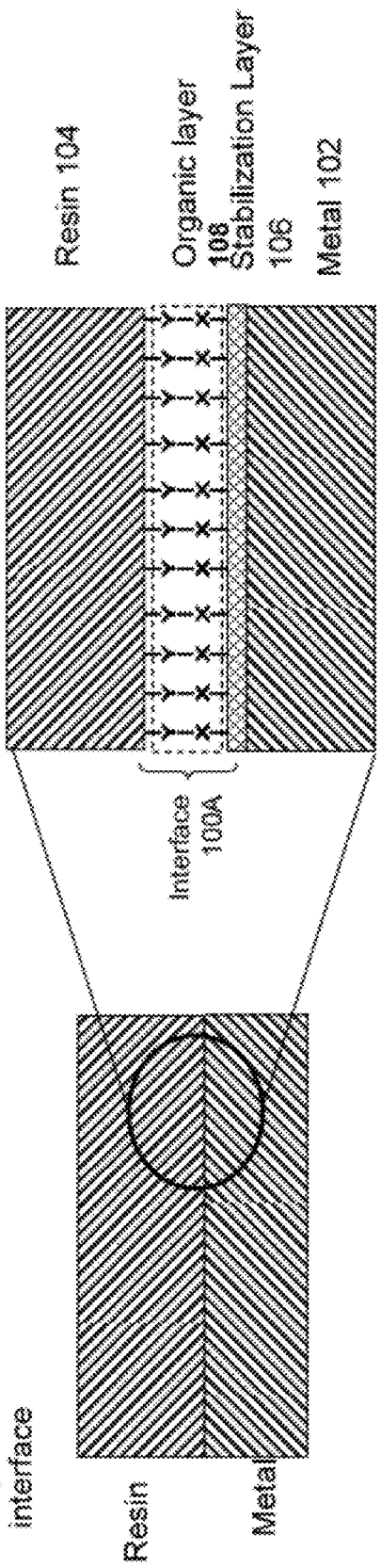
Fig. 1A Treated smooth metal-resin interface
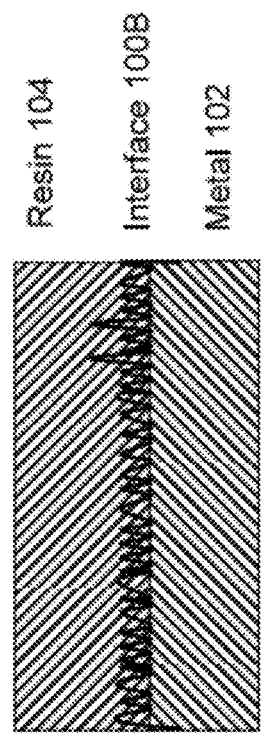
Fig. 1B Roughened metal-resin interface

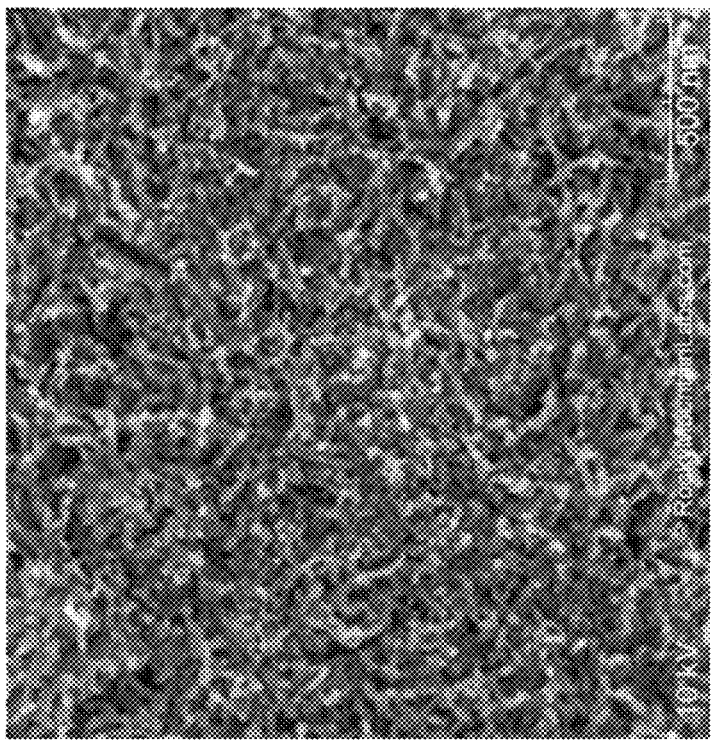
Fig. 3B Treated smooth Cu
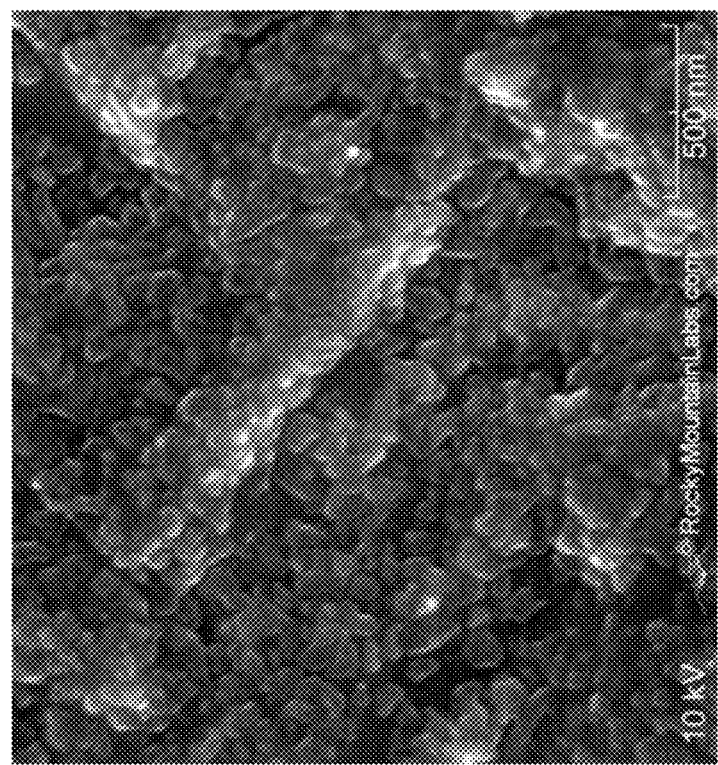
Fig. 3A As-plated smooth Cu (control)

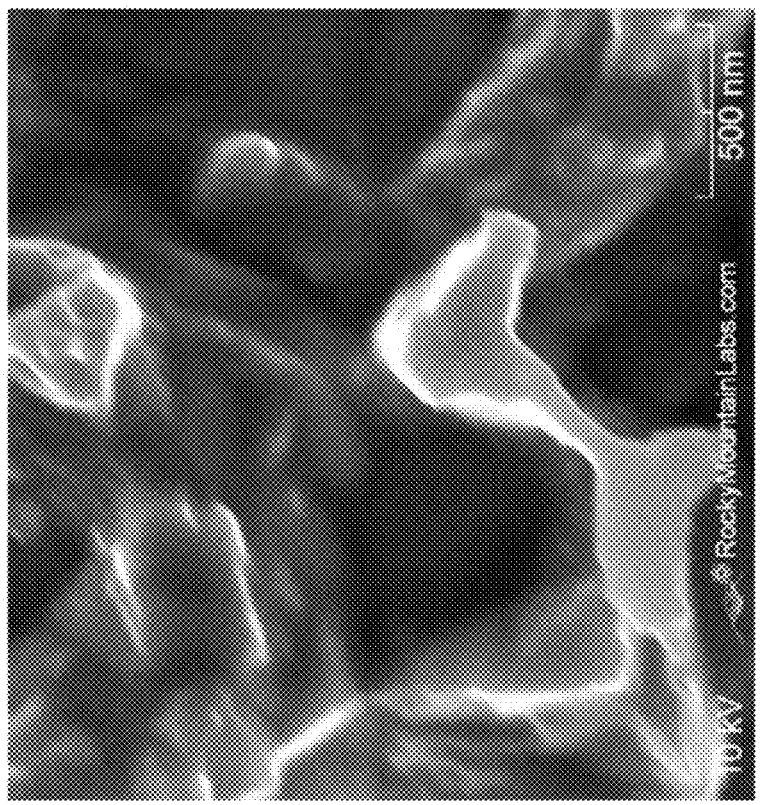
Fig. 3D Conventional micro-etched rough copper surface
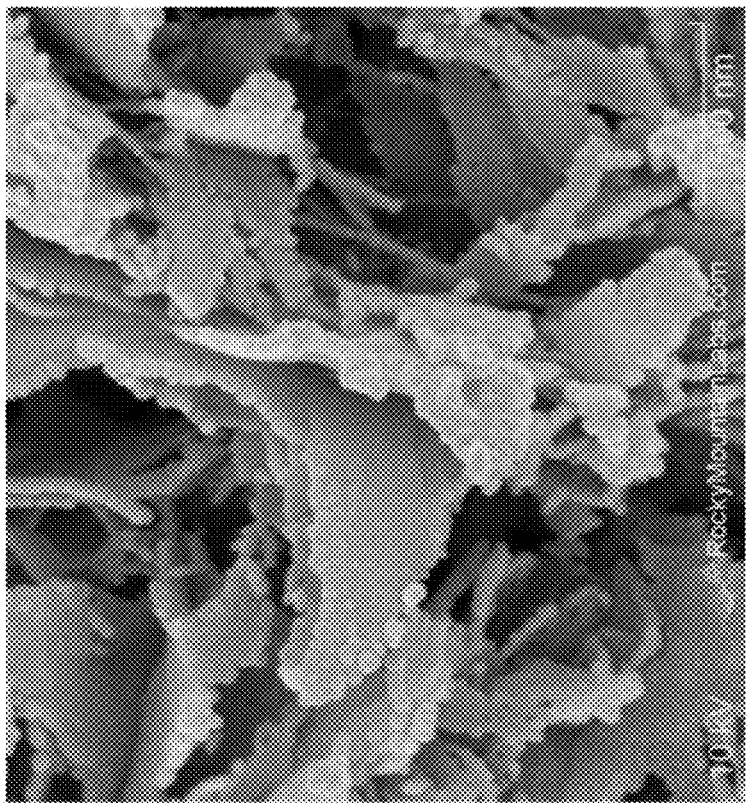
Fig. 3C Conventional rough black oxide surface

| Roughness | As-plated smooth Cu | Treated smooth Cu | Black oxide roughened Cu | Micro-etch roughened Cu |
|---|---|---|---|---|
| Ra (µm) | 0.13 | 0.14 | 0.49 | 0.47 |
| Rz (µm) | 1.31 | 1.45 | 5.20 | 4.50 |

Fig. 4

FIG. 7A. Tack BU epoxy and remove carrier film

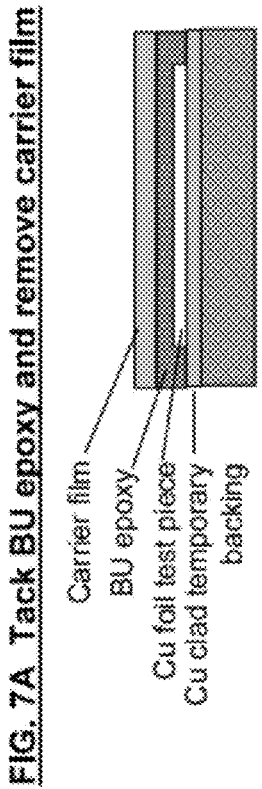

- Carrier film
- BU epoxy
- Cu foil test piece
- Cu clad temporary backing

Remove cover film from one side of BU epoxy and laminate to sample and temporary backing by:
1. Vacuum lamination at 100 °C, 30 s vacuum, 30 s press, 3 Kg/cm²
2. Cool and remove carrier film
3. Repeat 1 and 2 for two times (total 3 plies of BU film)

FIG. 7B. Laminate backing substrate

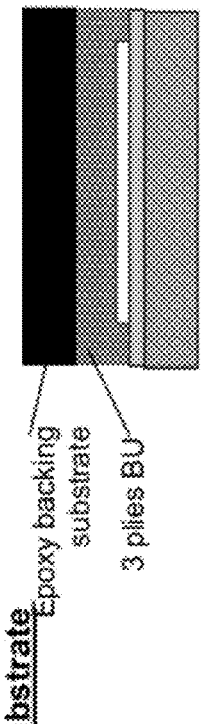

- Epoxy backing substrate
- 3 plies BU

Laminate epoxy backing substrate (stiffener) by vacuum lamination at 100 °C, 30 s vacuum, 60 s press, 3 Kg/cm²

FIG. 7C. Cure BU epoxy

Cure in convection oven at 180 °C for 90 minutes

FIG. 7D. Separate test specimens

Remove temporary backing, separate into individual test specimens, and prepare for peel test and HAST

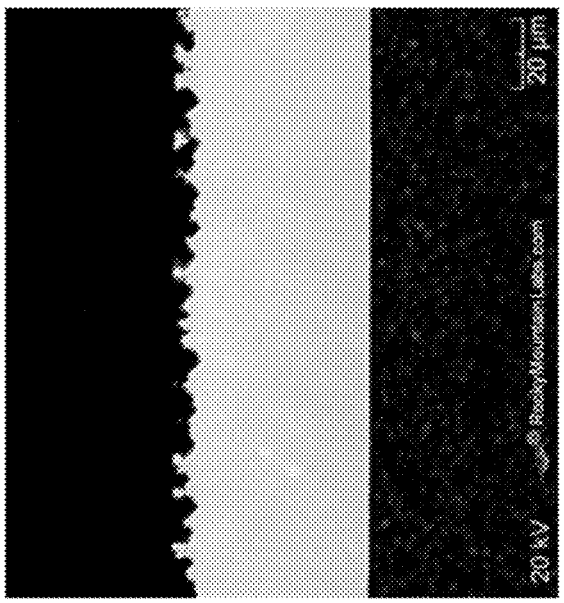
Fig. 9B: Post HAST
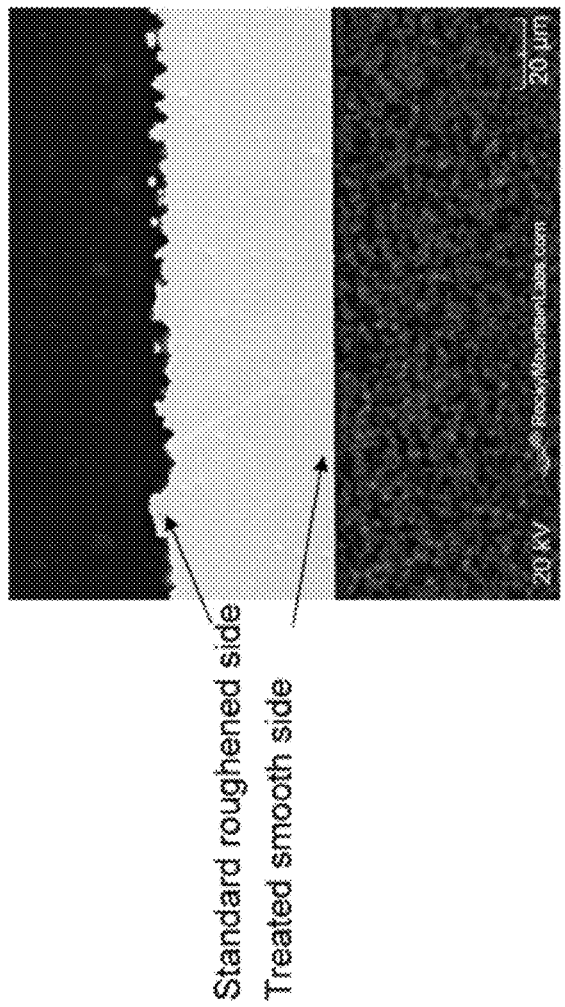
Fig. 9A: Before HAST
Standard roughened side
Treated smooth side

FIG. 10A
Surface appears to be clean Cu without resin transferred suggesting that the peeled surface breaks at the Cu-resin interface.
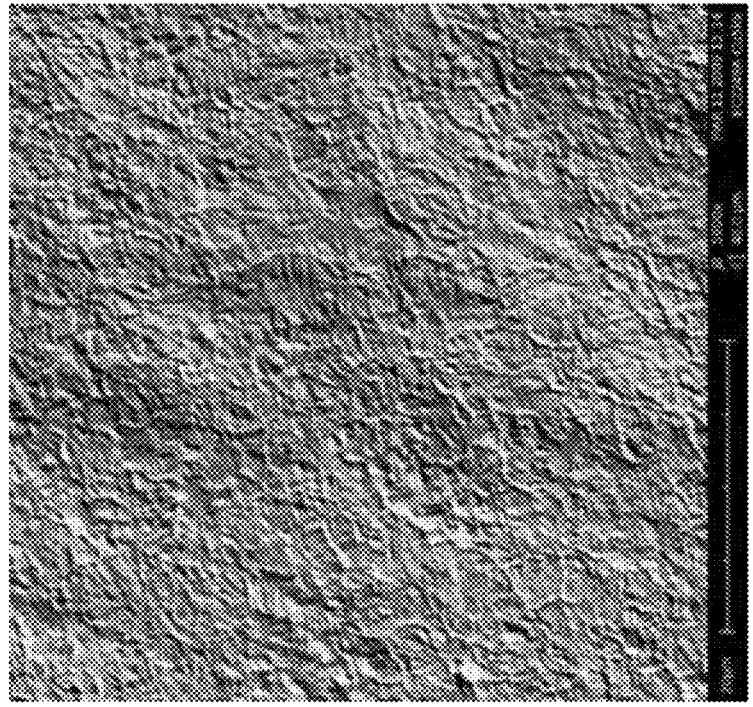
Topographic mode
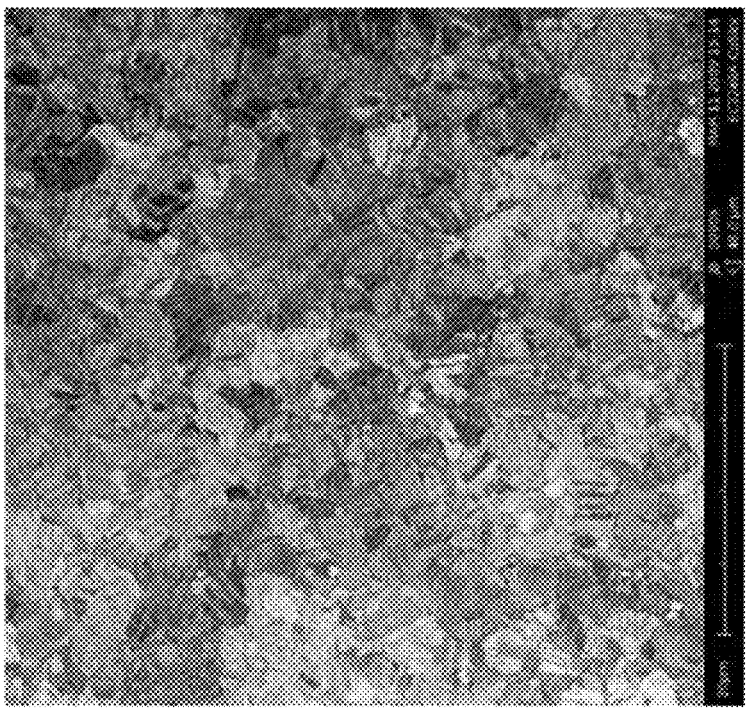
Full mode

FIG. 10B
Most areas covered by resin suggesting Cu-resin interface breaks within the resin, not at the Cu-resin interface
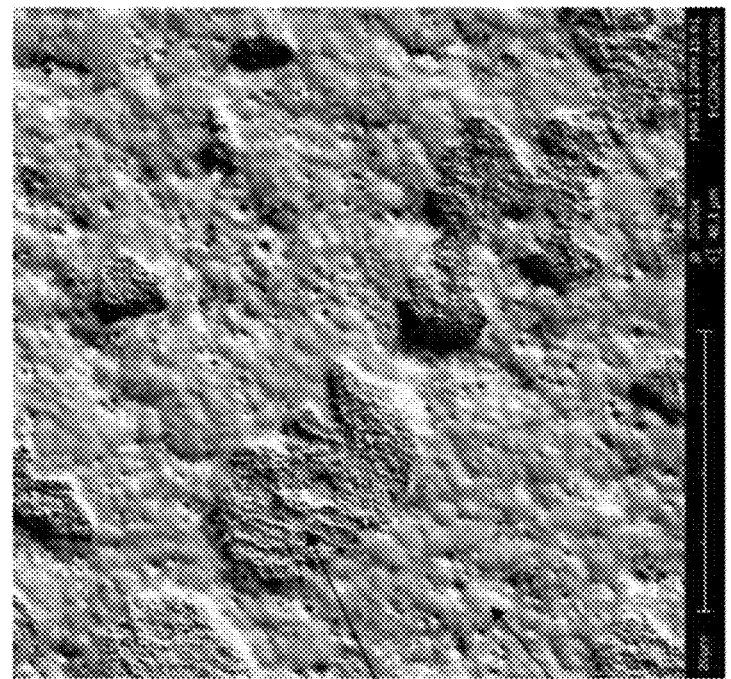
Topographic mode
Cu surface
Resin
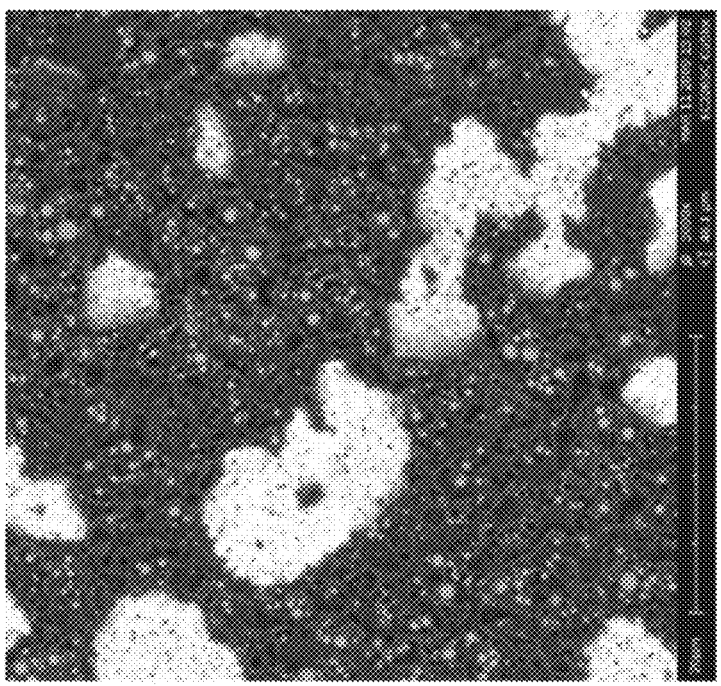
Full mode

| Substrates | Peel Strength (Kg/cm) | | Roughness ($R_a$, μm) |
|---|---|---|---|
| | Initial | 96 hr HAST | |
| Roughened | 0.65 | 0.20 | 0.53 |
| Smooth | 0.16 | 0.02 | 0.13 |
| Treated smooth | 0.68 | 0.53 | 0.14 |

METHODS OF TREATING COPPER SURFACES FOR ENHANCING ADHESION TO ORGANIC SUBSTRATES FOR USE IN PRINTED CIRCUIT BOARDS

CROSS REFERENCE TO RELATED APPLICATIONS

This Application is a United States National Stage Application filed under 35 U.S.C. §371 of International Application No. PCT/US2010/041091, entitled "Methods Of Treating Copper Surfaces For Enhancing Adhesion To Organic Substrates For Use In Printed Circuit Boards" which was filed on Jul. 6, 2010, the disclosure of which is hereby incorporated by reference in its entirety.

TECHNICAL FIELD

Embodiments of the present invention relate to the manufacture of printed circuit boards (PCB's) or printed wiring boards (PWB's), collectively referred to as PCB's; and particularly to methods for treating copper surfaces to increase the adhesion between a copper surface and an organic substrate used in a PCB. In some embodiments of the present invention, methods of achieving improved bonding strength without roughening the topography of a smooth copper surface are provided. The copper surface obtained by this method provides strong bonding to resin layers. The bonding interface between the treated copper and the resin layer of the PCB exhibits resistance to heat, moisture, and chemicals involved in post-lamination process steps.

BACKGROUND OF THE INVENTION

Miniaturization, portability, and ever-increasing functionalities of consumer electronics continually drive printed circuit board manufacturing towards smaller and more densely packed boards. Increased circuit layer count, decreased core and laminate thicknesses, reduced copper line width and spacing, smaller diameter through-holes and micro-vias are some of the key attributes of high density interconnect (HDI) packages or multilayer PCB's.

Copper circuitry forming the circuit layout of the PCB is fabricated typically either by a subtractive process, or an additive process, or their combination. In the subtractive process, the desired circuit pattern is formed by etching downward from a thin copper foil laminated to a dielectric substrate where the copper foil is covered with a photoresist and a latent image of the desired circuit is formed in the resist after light exposure, the non-circuit area of the resist is washed away in a resist developer and the underlying copper is etched away by an etchant. In the additive process, the copper pattern is built upward from a bare dielectric substrate in the channels of a circuit pattern formed by photoresist. Further copper circuit layers are bonded together by partially-cured dielectric resin, often called "prepreg," to form a multilayer assembly of alternating copper circuitry conductive layers and dielectric resin insulation layers. The assembly is then subjected to heat and pressure to cure the partially-cured resin. Through-holes are drilled and plated with copper to electrically connect all circuit layers and thus form a multilayer PCB. Processes for the fabrication of multilayer PCB's are well known in the art and described in numerous publications, for example, "Printed Circuits Handbook," Sixth Edition, Edited by C. F. Coombs, Jr., McGraw-Hill Professional, 2007 and "Printed Circuit Board Materials Handbook," Edited by M. W. Jawitz, McGraw-Hill, 1997. Regardless of the PCB structures and fabricating methods, it is essential to achieve good adhesion between the copper circuit layer and resin insulation layer. Circuit boards of insufficient adhesion cannot survive the high temperature of solder reflow and subsequent soldering, resulting in delamination of the board and electrical malfunctions.

The surface of the copper circuit as patterned is smooth; however, this smooth surface does not adhere well to the resin layer. It is theoretically known that increasing the contact area between the two dissimilar materials would increase the adhesion strength. To improve the bonding between the copper and the resin, most conventional approaches rely on creating a highly roughened copper surface to increase its surface area and introduce micro-ravines and ridges into the surface that act as mechanical bonding anchors to promote adhesion to the resin.

One of the most widely known and used approaches is the so-called "black oxide process" in which a black colored oxide layer having a rough surface is formed on top of the copper surface. The black oxide consists of needle-shaped dendritic crystals or whiskers of a mixture of cuprous oxide and cupric oxide of up to 5 microns in length. This large crystalline structure provides high surface area and mechanical anchoring effect and hence good bondability. U.S. Pat. Nos. 2,364,993, 2,460,896, and 2,460,898 to Meyer first describe the oxidation of a copper surface to a black oxide layer using an alkaline chlorite solution. Some exemplary disclosures of earlier efforts in applying this method to copper-resin bonding in PCB's include U.S. Pat. Nos. 2,955,974, 3,177,103, 3,198,672, 3,240,662, 3,374,129, and 3,481,777.

Although such needle-shaped oxide layer greatly increases the surface area and bondability, the dendritic crystals are fragile and easily damaged during the lamination process resulting in bonding failure within the oxide layer. Subsequent modifications to the oxide process have been focused on reducing the crystal size and therefore the thickness of the oxide layer to improve the mechanical stability by optimizing the reagent concentrations and other process parameters. Some notable improvements in this regard are represented by U.S. Pat. Nos. 4,409,037 and 4,844,981, where there are described formulations of an alkaline chlorite solution at specific concentration levels and hydroxide to chlorite ratios. U.S. Pat. No. 4,512,818 describes the addition of water soluble or dispersible polymer additives in an alkaline chlorite solution to cause a black oxide coating of reduced thickness and greater homogeneity. U.S. Pat. No. 4,702,793 describes a method of pre-treating the copper surface with sulfuroxy acid reducing agent to promote the rapid formation of a copper oxide. Other methods for forming black oxide layer include oxidation of the copper surface with hydrogen peroxide as described in U.S. Pat. No. 3,434,889, alkaline permanganate as described in U.S. Pat. No. 3,544,389, thermal oxidation as described in U.S. Pat. No. 3,677,828, and phosphoric acid—dichromate solution as described in U.S. Pat. No. 3,833,433.

One remaining problem associated with this oxide roughening approach is that copper oxides are soluble in acid; and serious delamination of the bonding interface occurs during later process steps which involve the use of acid. For example, as noted earlier through-holes are drilled through the multilayer board and plated with copper to provide interconnection of the circuit layers. Resin smear is often formed on the surface of the holes from drilling and must be removed by a desmear process which involves permanganate etch followed by acid neutralization. The acid can dissolve the copper oxide up to several millimeters inward from the surface of the hole, which is evidenced by the formation of a pink-ring around the through-hole owing to the pink color of the underlying copper. The formation of pink-rings corresponds to localized delamination and represents serious defects in the PCB's. These defects have become a significant bottleneck in the production of multilayer PCB's and extensive efforts have been extended in seeking further improvement in the oxide layer so that it is not susceptible to acid attack and such localized delamination.

Approaches to solving the pink-ring problem have largely involved post-treatment of the copper oxide. For example, U.S. Pat. No. 3,677,828 describes a method of first oxidizing the copper surface to form an oxide layer and then treating the oxide layer with phosphoric acid to form a glass like film of copper phosphate resulting in high bonding strength and acid resistance. U.S. Pat. No. 4,717,439 describes a process for improving the acid resistance of copper oxide by contacting the copper oxide with a solution containing an amphoteric element which forms an acidic oxide such as selenium dioxide. U.S. Pat. No. 4,775,444 describes a process of first forming copper oxide layer and then treating with chromic acid to stabilize and/or protect the copper oxide from dissolution in an acid.

A number of studies have shown that acid resistance is improved by first forming cupric oxide on the surface of the copper and subsequently reducing the cupric oxide to cuprous oxide or copper-rich surface. U.S. Pat. No. 4,642,161 describes a method of reducing the cupric oxide using a borane reducing agent represented by the general formula $BH_3NHRR'$, wherein R and R' are each selected from the group consisting of H, $CH_3$ and $CH_2CH_3$. U.S. Pat. No. 5,006,200 describes reducing agents selected from the group consisting of diamine ($N_2H_4$), formaldehyde (HCHO), sodium thiosulfate ($Na_2S_2O_3$) and sodium borohydride ($NaBH_4$). U.S. Pat. Nos. 5,721,014, 5,750,087, 5,753,309, and WO 99/02452 describe reducing agents consisting of cyclic borane compounds, such as morpholine borane, pyridine borane, piperidine borane, etc. The most commonly practiced method of reducing cupric oxide to form cuprous oxide is by use of the reducing agent dimethylamine borane (DMAB). This approach has reduced the radius of the pink-ring to certain degree, but is still limited and has not solved the problem completely since cuprous oxide is not completely insoluble in an acid.

To overcome the problem mentioned above, U.S. Pat. Nos. 5,492,595 and 5,736,065 describe methods of reducing the copper oxide to copper while maintaining the needle-like structure of the oxide. However, such needle-like structure is mechanically unstable and suffers from crush-down during the lamination process. Alternative oxide coating processes have been developed subsequently. Some exemplary processes are described in U.S. Pat. Nos. 5,532,094, 6,946,027B2, 5,807,493, 6,746,621B2, 5,869,130, 6,554,948, and 5,800,859. These alternative processes produce highly roughed copper surface by combining the traditional oxidation process with a controlled etch that roughens the underlying copper surface while oxidizing it at the same time. In many cases, an organic layer is coated simultaneously to act as corrosion inhibitor or adhesion promoter. In U.S. Pat. No. 5,800,859, there is described a micro-roughening process using an etching agent comprising hydrogen peroxide, an inorganic acid, and a corrosion inhibitor such as triazole. U.S. Pat. Nos. 6,716,281B2, 6,946,027B2, 7,108,795 B2, 7,211,204 B2, and 7,351,353 B1 describe a similar approach for providing roughened copper surface using a composition comprising an oxidizer, a pH adjuster, a topography modifier, a uniformity enhancer, and an azole inhibitor. For the same purpose, U.S. Pat. Nos. 5,532,094, 5,700,389, 5,807,493, 5,885,476, 5,965,036, 6,426,020B1, and 6,746,621B2 describe a micro-etching composition consisting of an oxidizer like hydrogen peroxide, a cupric ion source, an organic acid, a halide ion source, and an azole type inhibitor. These approaches have increased the acid resistance; however, the interface bonding is achieved mainly by mechanical anchors and the adhesion strength diminishes rapidly as the surface roughness of the treated copper surface decreases.

As is readily seen, while numerous approaches have been developed for improving the adhesion between the copper surface and dielectric resin used in PCBs, the approaches have relied on creating a highly roughened surface to promote adhesion. It is universally thought in the prior art that the copper surface must be roughened to increase the surface area for bonding or adhering to the epoxy or dielectric resins. This approach however suffers from a serve limitation since the width and/or spacing of the copper lines is limited thus preventing further miniaturization of the circuitry of the PCB. The current trend toward higher density PCBs with finer line circuitry and increased layer counts has generated the need for higher bonding strength of copper to dielectric resins while retaining the smooth surface. Clearly, there is a present need for further advances and developments of PCBs, such as but not limited to a copper surface treatment process that increases the bonding strength and yet does not roughen the copper surface.

SUMMARY OF THE INVENTION

Accordingly, some embodiments of the present invention provide methods for fabricating printed circuit boards (PCBs) by treating a smooth copper surface to increase the adhesion between a copper surface and an organic substrate. A copper surface treatment process that increases the bonding strength and yet does not significantly roughen the copper surface as provided by embodiments of the present invention is a complete departure from, and is contrary to, the conventional prior art techniques.

In further embodiments of the present invention methods of bonding a smooth copper surface and a resin in a PCB are provided in which the bonding interface has desired resistance to heat, moisture, and chemicals involved in post-lamination process steps.

In some embodiments, methods of forming a PCB are provided comprising the steps of: pre-cleaning a smooth copper surface with an alkaline and/or peroxide solution; stabilizing the surface by forming a copper oxide layer on the surface of copper; conditioning the oxide layer with a reducing agent, and optionally a coupling molecule to obtain the desired morphology, uniformity, and bonding sites; and bonding the surface of the treated copper and a resin together by, for example, heat and press. Is some embodiments, one or more molecules may be coupled to the copper oxide layer, the one or more organic molecules comprising a thermally stable base bearing one or more binding groups configured to bind the copper oxide surface and one or more attachment groups configured to attach to the resin.

In another embodiment, methods of fabricating a PCB are provided comprising the steps of: pre-cleaning a copper surface with an alkaline and/or peroxide solution; stabilizing the copper surface by forming a copper oxide layer thereon; terminating formation of the copper oxide by a self limiting reaction between the copper oxide and one or more inhibitor compounds; and bonding the treated copper surface with a resin. Is some embodiments, one or more molecules may be coupled to the copper oxide layer, the one or more organic molecules comprising a thermally stable base bearing one or more binding groups configured to bind the copper oxide surface and one or more attachment groups configured to attach to the resin.

BRIEF DESCRIPTION OF THE FIGURES

The foregoing and other aspects of the present invention will be apparent upon consideration of the following detailed description, taken in conjunction with the accompanying drawings, in which like reference characters refer to like parts throughout, and in which:

FIGS. 1A and 1B schematically illustrate one embodiment of the copper-resin bonding process according to the present invention as compared to the conventional roughening process;

FIGS. 3A to 3D show SEM photographs of: (A) a smooth copper surface prior to any treatment; (B) a copper surface treated according to one embodiment of the present invention which shows the smoothness of the treated surface; and compared to (C) a conventional rough black oxide surface as described in the prior art; and (D) a micro-roughened copper surface as described in the prior art;

FIG. 4 compares the surface roughness expressed in both Ra and Rz of the copper surfaces shown in FIGS. 3A to 3D;

FIGS. 7A to 7D are simplified cross sectional views showing the preparation of test samples and illustrating the lamination process used;

FIGS. 9A and 9B shows SEM cross-sectional views of a laminated treated copper surface formed according to embodiments of the present invention before HAST (FIG. 9A) and post HAST (FIG. 9B), demonstrating no delamination after HAST;

FIGS. 10A and 10B show SEM photographs of peeled copper surfaces demonstrating that the copper-resin interface breaks right at the copper surface for a smooth copper control (FIG. 10A) and the interface breaks within the resin for a smooth copper treated (FIG. 10B) according to one embodiment of the present invention;

DETAILED DESCRIPTION OF THE INVENTION

Figure 2:
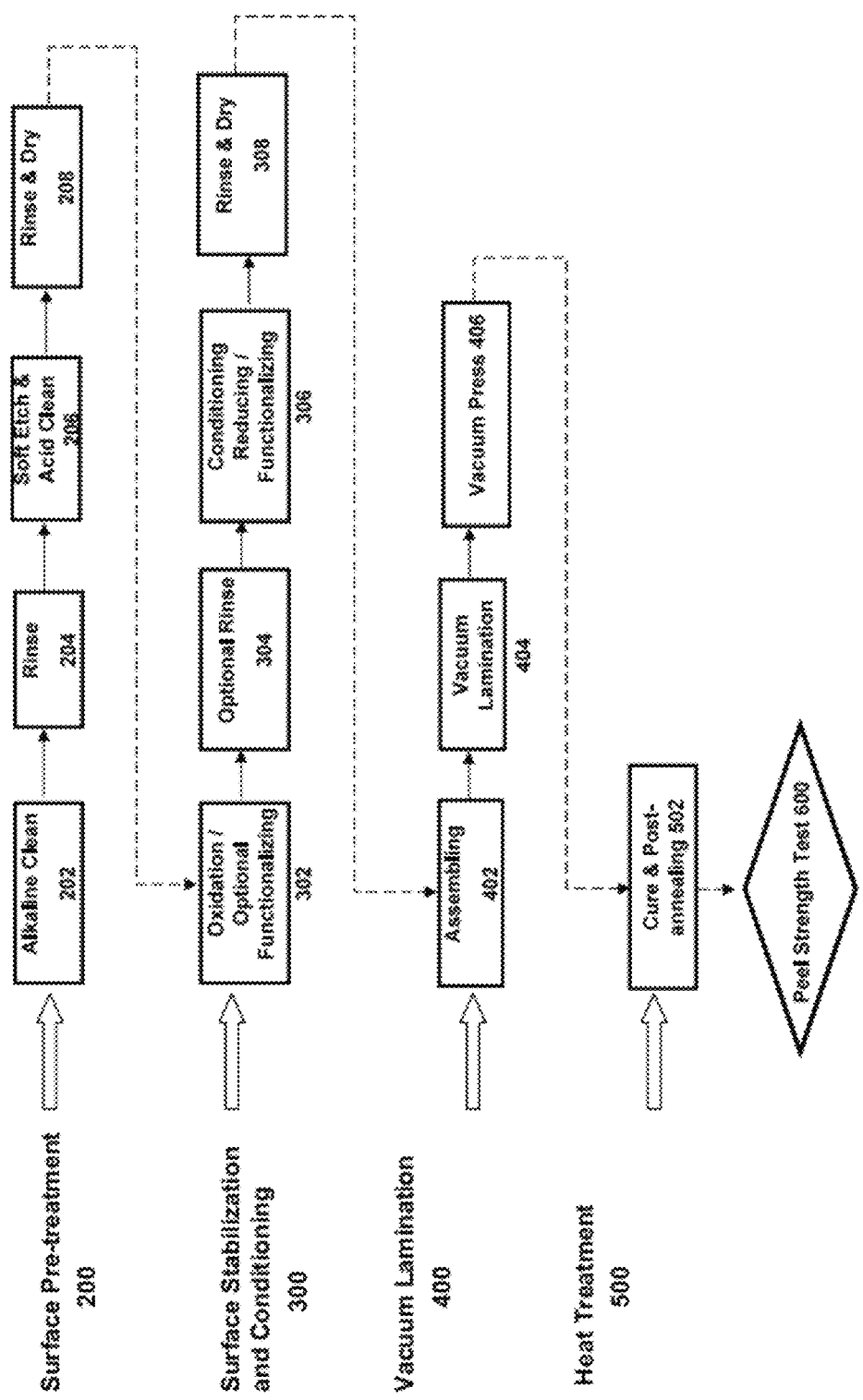
FIG. 2 illustrates experimental process flow diagrams illustrating one embodiment of the method of the present invention.

It is to be understood that both the foregoing general description and the following description are exemplary and explanatory only and are not restrictive of the methods and devices described herein. In this application, the use of the singular includes the plural unless specifically state otherwise. Also, the use of "or" means "and/or" unless state otherwise. Similarly, "comprise," "comprises," "comprising," "include," "includes," "including," "has," "have," and "having" are not intended to be limiting.

In some embodiments a method of fabricating a printed circuit board (PCB) to promote adhesion or binding between a copper surface and an organic substrate is provided comprising the steps of: stabilizing the copper surface by forming a copper oxide layer therein, and conditioning the copper oxide layer by reducing the copper oxide with a reducing agent.

Of particular advantage, the copper oxide layer, also sometimes referred to as a stabilization layer, exhibits unique features. In some embodiments the copper oxide layer after conditioning has a thickness of about 200 nanometers and less. In some embodiments the copper oxide has morphology comprised of a substantially amorphous structure.

In an exemplary embodiment the copper oxide layer has grains, and after conditioning the grains have a size in the range of 250 nanometers and less. In other embodiments the copper oxide layer has grains, and after conditioning the grains have a size in the range of 200 nanometers and less. In some embodiments the copper oxide has grains, and after conditioning the grains are substantially randomly oriented.

The copper surface is stabilized by exposing the copper surface to an oxidant. In an exemplary embodiment the oxidant is selected from any one or more of: sodium chloride, hydrogen peroxide, permanganate, perchlorate, persulphate, ozone, or mixtures thereof. The step of stabilizing the copper surface may be carried out at a temperature in the range of room temperature to about 80° C.

After stabilization, the copper oxide layer is conditioned with a reducing agent. In some embodiments the reducing agent is selected from any one or more of: formaldehyde, sodium thiosulfate, sodium borohydride, a borane reducing agent represented by the general formula $BH_3NHRR'$, wherein R and R' are each selected from the group consisting of H, $CH_3$ and $CH_2CH_3$, such as dimethylamine borane (DMAB), a cyclic borane, such as morpholine borane, pyridium borane or piperidine borane.

Of particular advantage, embodiments of the present invention provide an approach for fabricating PCBs from a "smooth" copper substrate, meaning a copper substrate that has not been previously roughened. For example, copper substrates suitable for use in methods of the present invention include, but are not limited to, electrolytic or electroplated copper, electroless copper, and rolled copper, and are not restricted by the method of preparing the same.

In some embodiments the copper substrate or surface has a roughness of about 0.13 μm Ra. In some embodiment the copper oxide, or also referred to as treated smooth copper surface or stabilization layer, has a roughness of about 0.14 μm Ra or less.

In another aspect, the present invention provides methods of fabricating a printed circuit board, comprising the steps of: pre-cleaning a copper surface with an alkaline and/or peroxide solution; stabilizing the copper surface by forming a copper oxide layer thereon; conditioning the copper oxide layer with a reducing agent; and bonding the treated copper surface with a resin.

Turing to FIGS. 1A and 1B there is illustrated one exemplary embodiment of a simplified schematic of a smooth copper-resin bonding interface 100A comprising a smooth copper substrate 102 bonded to a smooth resin substrate 104.

A stabilization layer 106 of either a dense oxide layer or an organic layer is formed on top of the copper to prevent the copper surface from corrosion or chemical attack which is a main cause of interface failure. In some embodiments it may be desirable, but not necessary, to facilitate chemical bonding by further conditioning or priming the stabilization layer 106 with an organic molecular layer to form active bonding sites X which will react with functional groups Y in the resin 104, forming covalent bonds. In the exemplary embodiment, the smooth copper-resin interface possesses superior adhesion strength and resistance to heat, moisture, and chemical attacks compared to roughened copper-resin interface 100B known in the previous arts that the interface bonding is achieved mainly by mechanical anchors.

Referring to FIG. 2, in order to further illustrate the features of the present invention, an exemplary experimental process flow is schematically illustrated therein and comprises four major steps: (1) surface pre-treatment 200, (2) surface stabilization and conditioning 300, (3) vacuum lamination 400, and (4) heat treatment 500. The specific data and results are shown for illustrative purposes only and are not intended to limit the scope of the invention in any way. FIG. 2 also shows where in the process the peel strength tests are carried out, however this is shown only to illustrate the testing procedures. The broad method steps of the present invention do not include the peeling test steps.

In the exemplary method shown in FIG. 2, surface pre-treatment is carried out by alkaline clean at 202, rinsing at 204, soft etching and acid clean at 206, and rinsing and drying the substrate at 208.

Next the surface is stabilized by surface oxidation at 302, and rinsing at 304. Then the surface is conditioned by reduction at 306 which may include optional functionalization, followed by rinsing and drying the substrate at 308.

After the conditioning step 306, vacuum lamination is carried out by assembling the laminate film at 402 over the stabilized substrate, vacuum lamination at 404, and optional vacuum press at 406.

Next heat treatment is performed to cure or anneal the laminated assembly at 502, which is then followed by peel strength testing at 600.

Additionally, some embodiments of the present invention provide for contacting the metal surface with one or more organic molecules comprising a thermally stable base bearing one or more binding groups configured to bind the metal surface and one or more attachment groups configured to attach to the organic substrate. In an exemplary embodiment the one or more surface modifier molecules is a surface active molecule (SAM) or moiety.

Of particular advantage, the PCB includes a copper oxide layer, also sometimes referred to as a stabilization layer, that exhibits unique features. In some embodiments the copper oxide layer after conditioning has a thickness of about 200 nanometers and less. In some embodiments the copper oxide has morphology comprised of a substantially amorphous structure.

In an exemplary embodiment the copper oxide layer has a highly distributed grain structure, and after conditioning the grains have a size in the range of 200 nanometers and less. In other embodiments the copper oxide layer has grains, and after conditioning the grains have a size in the range of 100 nanometers and less. In some embodiments the copper oxide has grains, and after conditioning the grains are substantially randomly oriented.

The copper surface is stabilized by exposing the copper surface to an oxidant. In an exemplary embodiment the oxidant is selected from any one or more of: sodium chlorite, hydrogen peroxide, permaganate, perchlorate, persulphate, ozone, or mixtures thereof. The step of stabilizing the copper surface may be carried out at a temperature in the range of room temperature to about 80° C. Alternatively, the copper surface can be stabilized by thermal oxidation and electrochemical anodic oxidation.

After stabilization, the copper oxide layer is conditioned with a reducing agent. In some embodiments the reducing agent is selected from any one or more of: formaldehyde, sodium thiosulfate, sodium borohydride, a borane reducing agent represented by the general formula $BH_3NHRR'$, wherein R and R' are each selected from the group consisting of H, $CH_3$ and $CH_2CH_3$, such as dimethylamine borane (DMAB), a cyclic borane, such as morpholine borane, pyridium borane or piperidine borane.

Conditioning of the copper oxide layer may be carried out at a temperature in the range of room temperature to about 50° C. In some embodiments the entire method is carried out for a time in the range of about 2 to 20 minutes.

Additionally, some embodiments of the present invention provide for, after conditioning, contacting the copper oxide surface with one or more organic surface active molecules (SAMs) comprising a thermally stable base bearing one or more binding groups configured to bind the copper oxide surface and one or more attachment groups configured to attach to the organic substrate. In an exemplary embodiment the one or more organic surface active molecules is a surface active moiety.

Any suitable surface active molecule or moiety may be employed. In some embodiments the surface modifier moiety is selected from the group consisting of a macrocyclic proligand, a macrocyclic complex, a sandwich coordination complex and polymers thereof. Alternatively the surface modifier compound may be comprised of a porphyrin.

The one or more surface active molecules (SAM) may be selected from the group of: a porphyrin, a porphyrinic macrocycle, an expanded porphyrin, a contracted porphyrin, a linear porphyrin polymer, a porphyrinic sandwich coordination complex, a porphyrin array, a silane, a tetraorgano-silane, aminoethyl-aminopropyl-trimethoxysilane, (3-Aminopropyl)trimethoxysilane, (1-[3-(Trimethoxysilyl)propyl]urea), (3-Aminopropyl)triethoxysilane, (3-Glycidyloxypropyl)trimethoxysilane), (3-Chloropropyl)trimethoxysilane, (3-Glycidyloxypropyl)trimethoxysilane, Dimethyldichlorosilane, 3-(Trimethoxysilyl)propyl methacrylate, Ethyltriacetoxysilane, Triethoxy(isobutyl)silane, Triethoxy(octyl)silane, Tris (2-methoxyethoxy)(vinyl)silane, Chlorotrimethylsilane, Methyltrichlorosilane, Silicon tetrachloride, Tetraethoxysilane, Phenyltrimethoxysilane, Chlorotriethoxysilane, ethylene-trimethoxysilane, an amine, a sugar or any combination of the above. Alternatively, inorganic molecules from the group consisting of molybdates, tungstates, tantalates, niobates, vanadates, isopoly or heteropoly acids of molybdenum, tungsten, tantalum, niobium, vanadium, and combinations of any of the foregoing can be used for the same purpose.

In some embodiments the one or more attachment group is comprised of an aryl functional group and/or an alkyl attachment group. When the attachment group is an aryl, the aryl functional group may be comprised of a functional group selected from any one or more of: acetate, alkylamino, allyl, amine, amino, bromo, bromomethyl, carbonyl, carboxylate, carboxylic acid, dihydroxyphosphoryl, epoxide, ester, ether, ethynyl, formyl, hydroxy, hydroxymethyl, iodo, mercapto, mercaptomethyl, Se-acetylseleno, Se-acetylselenomethyl, S-acetylthio, S-acetylthiomethyl, selenyl, 4,4,5,5-tetramethyl-1,3,2-dioxaborolan-2-yl, 2-(trimethylsilyl)ethynyl, vinyl, and combinations thereof.

When the attachment group is comprised of an alkyl, the alkyl attachment group comprises a functional group selected from any one or more of: acetate, alkylamino, allyl, amine, amino, bromo, bromomethyl, carbonyl, carboxylate, carboxylic acid, dihydroxyphosphoryl, epoxide, ester, ether, ethynyl, formyl, hydroxy, hydroxymethyl, iodo, mercapto, mercaptomethyl, Se-acetylseleno, Se-acetylselenomethyl, S-acetylthio, S-acetylthiomethyl, selenyl, 4,4,5,5-tetramethyl-1,3,2-dioxaborolan-2-yl, 2-(trimethylsilyl)ethynyl, vinyl, and combinations thereof.

In an alternative embodiment the at least one attachment group is comprised of an alcohol or a phosphonate. In further embodiments, the at least one attachment group may be comprised of any one of more of: amines, alcohols, ethers, other nucleophile, phenyl ethynes, phenyl allylic groups, phosphonates and combinations thereof.

In general, in some embodiments the organic molecule is comprised of a thermally stable unit or base with one more binding groups X and one or more attachment groups Y. In certain embodiments, the organic molecule is heat-resistant metal-binding molecule, and may be comprised of one or more "surface active moieties," also referred to in associated applications as "redox active moieties" or "ReAMs". In general, in some embodiments there are several types of surface active moieties useful in the present invention, all based on polydentate proligands, including macrocyclic and non-macrocyclic moieties.

Suitable proligands fall into two categories: ligands which use nitrogen, oxygen, sulfur, carbon or phosphorus atoms (depending on the metal ion) as the coordination atoms (generally referred to in the literature as sigma (a) donors) and organometallic ligands such as metallocene ligands.

In addition, a single surface active moiety may have two or more redox active subunits, and utilize porphyrins and ferrocenes.

In some embodiments, the surface active moiety is a macrocyclic ligand, which includes both macrocyclic proligands and macrocyclic complexes. By "macrocyclic proligand" herein is meant a cyclic compound which contains donor atoms (sometimes referred to herein as "coordination atoms") oriented so that they can bind to a metal ion and which are large enough to encircle the metal atom. In general, the donor atoms are heteroatoms including, but not limited to, nitrogen, oxygen and sulfur, with the former being especially preferred. However, as will be appreciated by those in the art, different metal ions bind preferentially to different heteroatoms, and thus the heteroatoms used can depend on the desired metal ion. In addition, in some embodiments, a single macrocycle can contain heteroatoms of different types.

A "macrocyclic complex" is a macrocyclic proligand with at least one metal ion; in some embodiments the macrocyclic complex comprises a single metal ion, although as described below, polynucleate complexes, including polynucleate macro cyclic complexes, are also contemplated.

A wide variety of macrocyclic ligands find use in the present invention, including those that are electronically conjugated and those that may not be. In some embodiments, the rings, bonds and substitutents are chosen to result in the compound being electronically conjugated, and at a minimum to have at least two oxidation states.

In some embodiments, the macrocyclic ligands of the invention are selected from the group consisting of porphyrins (particularly porphyrin derivatives as defined below), and cyclen derivatives. A particularly preferred subset of macrocycles suitable in the invention include porphyrins, including porphyrin derivatives. Such derivatives include porphyrins with extra rings ortho-fused, or ortho-perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral meso-, 3- or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g. phthalocyanines, sub-phthalocyanines, and porphyrin isomers). Additional suitable porphyrin derivatives include, but are not limited to the chlorophyll group, including etiophyllin, pyrroporphyrin, rhodoporphyrin, phylloporphyrin, phylloerythrin, chlorophyll a and b, as well as thehemoglobin group, including deuteroporphyrin, deuterohemin, hemin, hematin, protoporphyrin, mesohemin, hematoporphyrin mesoporphyrin, coproporphyrin, uroporphyrin and turacin, and the series of tetraarylazadipyrromethines.

As will be appreciated by those in the art, each unsaturated position, whether carbon or heteroatom, can include one or more substitution groups as defined herein, depending on the desired valency of the system.

In addition, included within the definition of "porphyrin" are porphyrin complexes, which comprise the porphyrin proligand and at least one metal ion. Suitable metals for the porphyrin compounds will depend on the heteroatoms used as coordination atoms, but in general are selected from transition metal ions. The term "transition metals" as used herein typically refers to the 38 elements in groups 3 through 12 of the periodic table. Typically transition metals are characterized by the fact that their valence electrons, or the electrons they use to combine with other elements, are present in more than one shell and consequently often exhibit several common oxidation states. In certain embodiments, the transition metals of this invention include, but are not limited to one or more of scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, palladium, gold, mercury, rutherfordium, and/or oxides, and/or nitrides, and/or alloys, and/or mixtures thereof.

There are also a number of macrocycles based on cyclen derivatives including macrocyclic proligands loosely based on cyclen/cyclam derivatives, which can include skeletal expansion by the inclusion of independently selected carbons or heteroatoms. In some embodiments, at least one R group is a surface active subunit, preferably electronically conjugated to the metal. In some embodiments, including when at least one R group is a surface active subunit, two or more neighboring R2 groups form cyclo or an aryl group. In the present invention, the at least one R group is a surface active subunit or moiety.

Furthermore, in some embodiments, macrocyclic complexes relying organometallic ligands are used. In addition to purely organic compounds for use as surface active moieties, and various transition metal coordination complexes with δ-bonded organic ligand with donor atoms as heterocyclic or exocyclic substituents, there is available a wide variety of transition metal organometallic compounds with pi-bonded organic ligands (see Advanced Inorganic Chemistry, 5th Ed., Cotton & Wilkinson, John Wiley & Sons, 1988, chapter 26; Organometallics, A Concise Introduction, Elschenbroich et al., 2nd Ed., 1992, 30 VCH; and Comprehensive Organometallic Chemistry II, A Review of the Literature 1982¬ 1994, Abel et al. Ed., Vol. 7, chapters 7, 8, 1.0 & 11, Pergamon Press, hereby expressly incorporated by reference). Such organometallic ligands include cyclic aromatic compounds such as the cyclopentadienide ion $[C_5H_5(-1)]$ and various ring substituted and ring fused derivatives, such as the indenylide (−1) ion, that yield a class of bis(cyclopentadieyl)metal compounds, (i.e. the metallocenes); see for example Robins et al., J. Am. Chem. Soc. 104:1882-1893 (1982); and Gassman et al., J. Am. Chem. Soc. 108:4228-4229 (1986), incorporated by reference. Of these, ferrocene $[(C_5H_5)_2Fe]$ and its derivatives are prototypical examples which have been used in a wide variety of chemical (Connelly et al., Chem. Rev. 96:877-910 (1996), incorporated by reference) and electrochemical (Geiger et al., Advances in Organometallic Chemistry 23:1-93; and Geiger et al., Advances in Organometallic Chemistry 24:87, incorporated by reference) reactions. Other potentially suitable organometallic ligands include cyclic arenes such as benzene, to yield bis(arene)metal compounds and their ring substituted and ring fused derivatives, of which bis(benzene)chromium is a prototypical example, Other acyclic n-bonded ligands such as the allyl(−1) ion, or butadiene yield potentially suitable organometallic compounds, and all such ligands, in conjunction with other 7c-bonded and 8-bonded ligands constitute the general class of organometallic compounds in which there is a metal to carbon bond. Electrochemical studies of various dimers and oligomers of such compounds with bridging organic ligands, and additional non-bridging ligands, as well as with and without metal-metal bonds are all useful.

In some embodiments, the surface active moieties are sandwich coordination complexes. The terms "sandwich coordination compound" or "sandwich coordination complex" refer to a compound of the formula L-Mn-L, where each L is a heterocyclic ligand (as described below), each M is a metal, n is 2 or more, most preferably 2 or 3, and each metal is positioned between a pair of ligands and bonded to one or more hetero atom (and typically a plurality of hetero atoms, e.g., 2, 3, 4, 5) in each ligand (depending upon the oxidation state of the metal). Thus sandwich coordination compounds are not organometallic compounds such as ferrocene, in which the metal is bonded to carbon atoms. The ligands in the sandwich coordination compound are generally arranged in a stacked orientation (i.e., are generally cofacially oriented and axially aligned with one another, although they may or may not be rotated about that axis with respect to one another) (see, e.g., Ng and Jiang (1997) Chemical Society Reviews 26: 433-442) incorporated by reference. Sandwich coordination complexes include, but are not limited to "double-decker sandwich coordination compound" and "triple-decker sandwich coordination compounds". The synthesis and use of sandwich coordination compounds is described in detail in U.S. Pat. Nos. 6,212,093; 6,451,942; 6,777,516; and polymerization of these molecules is described in WO 2005/086826, all of which are included herein, particularly the individual substitutent groups that find use in both sandwich complexes and the "single macrocycle" complexes.

In addition, polymers of these sandwich compounds are also of use; this includes "dyads" and "triads" as described in U.S. Pat. Nos. 6,212,093; 6,451,942; 6,777,516; and polymerization of these molecules as described in WO 2005/086826, all of which are incorporated by reference and included herein.

Surface active moieties comprising non-macrocyclic chelators are bound to metal ions to form non-macrocyclic chelate compounds, since the presence of the metal allows for multiple proligands to bind together to give multiple oxidation states.

In some embodiments, nitrogen donating proligands are used. Suitable nitrogen donating proligands are well known in the art and include, but are not limited to, $NH_2$; NFIR; NRR'; pyridine; pyrazine; isonicotinamide; imidazole; bipyridine and substituted derivatives of bipyridine; terpyridine and substituted derivatives; phenanthrolines, particularly 1,10-phenanthroline (abbreviated phen) and substituted derivatives of phenanthrolines such as 4,7-dimethylphenanthroline and dipyridol[3,2-a:2',3'-c]phenazine (abbreviated dppz); dipyridophenazine; 1,4,5,8,9,12-hexaazatriphenylene (abbreviated hat); 9,10-phenanthrenequinone diimine (abbreviated phi); 1,4,5,8-tetraazaphenanthrene (abbreviated tap); 1,4,8,11-tetra-azacyclotetradecane (abbreviated cyclam) and isocyanide. Substituted derivatives, including fused derivatives, may also be used. It should be noted that macrocylic ligands that do not coordinatively saturate the metal ion, and which require the addition of another proligand, are considered non-macrocyclic for this purpose. As will be appreciated by those in the art, it is possible to covalent attach a number of "non-macrocyclic" ligands to form a coordinatively saturated compound, but that is lacking a cyclic skeleton.

Suitable sigma donating ligands using carbon, oxygen, sulfur and phosphorus are known in the art. For example, suitable sigma carbon donors are found in Cotton and Wilkenson, Advanced Organic Chemistry, 5th Edition, John Wiley & Sons, 1988, hereby incorporated by reference; see page 38, for example. Similarly, suitable oxygen ligands include crown ethers, water and others known in the art. Phosphines and substituted phosphines are also suitable; see page 38 of Cotton and Wilkenson.

The oxygen, sulfur, phosphorus and nitrogen-donating ligands are attached in such a manner as to allow the heteroatoms to serve as coordination atoms.

In addition, some embodiments utilize polydentate ligands that are polynucleating ligands, e.g. they are capable of binding more than one metal ion. These may be macrocyclic or non-macrocyclic. The molecular elements herein may also comprise polymers of the surface active moieties as outlined above; for example, porphyrin polymers (including polymers of porphyrin complexes), macrocycle complex polymers, surface active moieties comprising two surface active subunits, etc. can be utilized. The polymers can be homopolymers or heteropolymers, and can include any number of different mixtures (admixtures) of monomeric surface active moiety, wherein "monomer" can also include surface active moieties comprising two or more subunits (e.g. a sandwich coordination compound, a porphyrin derivative substituted with one or more ferrocenes, etc.). Surface active moiety polymers are described in WO 2005/086826, which is expressly incorporated by reference in its entirety.

In certain embodiments, the attachment group Y comprises an aryl functional group and/or an alkyl attachment group. In certain embodiments, the aryl functional group comprises a functional group selected from the group consisting of amino, alkylamino, bromo, iodo, hydroxy, hydroxymethyl, formyl, bromomethyl, vinyl, allyl, S-acetylthiomethyl, Se-acetylselenomethyl, ethynyl, 2-(trimethylsilyl)ethynyl, mercapto, mercaptomethyl, 4,4,5,5-tetramethyl-1,3,2-dioxaborolan-2-yl, and dihydroxyphosphoryl. In certain embodiments, the alkyl attachment group comprises a functional group selected from the group consisting of bromo, iodo, hydroxy, formyl, vinyl, mercapto, selenyl, S-acetylthio, Se-acetylseleno, ethynyl, 2-(trimethylsilyl)ethynyl, 4,4,5,5-tetramethyl-1,3,2-dioxaborolan-2-yl, and dihydroxyphosphoryl. In certain embodiments, the attachment group comprises an alcohol or a phosphonate.

In some embodiments, the surface active moieties are silanes, characterized by the formula, $A_{(4-x)}SiB_xY$, wherein each A is independently a hydrolysable group, e.g. a hydroxyl or alkoxy group, where x=1 to 3, and B is independently an alkyl or aryl group, that may or may not contain attachment groups, Y, as described above.

In some embodiments the invention provides a method of manufacturing a PCB using a smooth copper substrate, meaning a copper substrate that has not been previously roughened. For example, copper substrates suitable for use in methods of the present invention include, but are not limited to, electrolytic or electroplated copper, electroless copper, and rolled copper, and not restricted by the method of preparing the same.

In further aspects, a printed circuit board is provided comprising a polymer material, such as an epoxy, which may contain a substantial amount of a filler material, such as glass, silica, or other materials, modified on its surface with a chemical adhesive material, such as a porphyrin, that substantially alters its chemical affinity for a metal, such as but not limited to copper, in order to facilitate strong adhesion between the polymer composite and the metal layer. A second layer of the chemical adhesive layer may be applied to the metal surface, to promote adhesion between it and subsequent polymer (epoxy/glass) layers. In some embodiments, the PCB is a multilayer conductive structure.

In another aspect, the present invention provides methods of fabricating a printed circuit board, comprising the steps of: pre-cleaning a copper surface with an alkaline and/or peroxide solution; stabilizing the copper surface by forming a copper oxide layer thereon; terminating formation of the copper oxide by a self limiting reaction between the copper oxide and one or more inhibitor compounds; and bonding the treated copper surface with a resin. Is some embodiments, one or more molecules may be coupled to the copper oxide layer, the one or more organic molecules comprising a thermally stable base bearing one or more binding groups configured to bind the copper oxide surface and one or more attachment groups configured to attach to the resin.

EXPERIMENTAL

A number of experiments were conducted as described below. These examples are shown for illustration purposes only and are not intended to limit the invention in any way.

EXAMPLES

Example 1

Treatment of a Smooth Copper Substrate

This example illustrates one exemplary approach for treating a smooth copper substrate according to some embodiments of the present invention. As discussed above, methods of the invention enable the use of a smooth copper substrate, meaning a copper substrate that has not been previously roughened. Such a copper substrate can be from a variety of sources. For example, copper substrates suitable for use in methods of the present invention include, but are not limited to, electrolytic or electroplated copper, electroless copper, and rolled copper, and not restricted by the method of preparing the same. In this Example 1, an electrolytic copper substrate was first cleaned with 20-40 g/L sodium hydroxide solution at 40-60° C. for 2-5 minutes, and then rinsed with water. The copper substrate was further cleaned in 1-3 wt % hydrogen peroxide solution plus 2-5 wt % sulfuric acid at RT for 1-5 minute, and 5-20 wt % sulfuric acid solution at RT for 1 minute, and then followed by water rinse. The substrate was then stabilized by oxidation in a 140-200 g/L chlorite solution with 10-50 g/L sodium hydroxide containing less than 1% of a SAM at 50-80° C. for 2-8 minutes followed by water rinse. The sample can then be treated in a reducing bath of 10-40 g/L dimethylamine borane (DMAB) with pH adjusted to 10.5-12.5 at RT-40° C. for 2-5 minutes. The sample was then rinsed and dried by hot air. The surface morphology and the thickness of the stabilization layer can be adjusted by varying the concentrations of the treatment solutions, the temperature, and duration, and characterized by SEM, XRD, and Auger depth profile.

FIG. 3A is an exemplary SEM micrograph at a magnification of 50,000 showing a typical morphology of a conventional electrolytic copper surface (i.e. a smooth copper surface, or in other words a copper surface that has not been roughened) with nodular grains and directional grain growth reflecting the long range order of the crystalline structure. In comparison, the morphology of an electrolytic copper surface treated according to the methods of the present invention is shown in FIG. 3B. As is very apparent, the stabilization layer on the treated copper surface shown in FIG. 3B exhibits a morphology of finer grains, unidirectional grain growth, and greater uniformity. By contrast, FIG. 3C shows a conventional black oxide surface which exhibits a much thicker and fragile fibrous structure. FIG. 3D is an exemplary SEM micrograph of a conventional micro-etched copper surface which shows a morphology of highly un-uniform micro-ravines and ridges.

The tabular data of FIG. 4 compares the surface roughness expressed in both Ra and Rz, and demonstrates that the treatment of the present invention does not roughen the copper surface.

Figure 5:
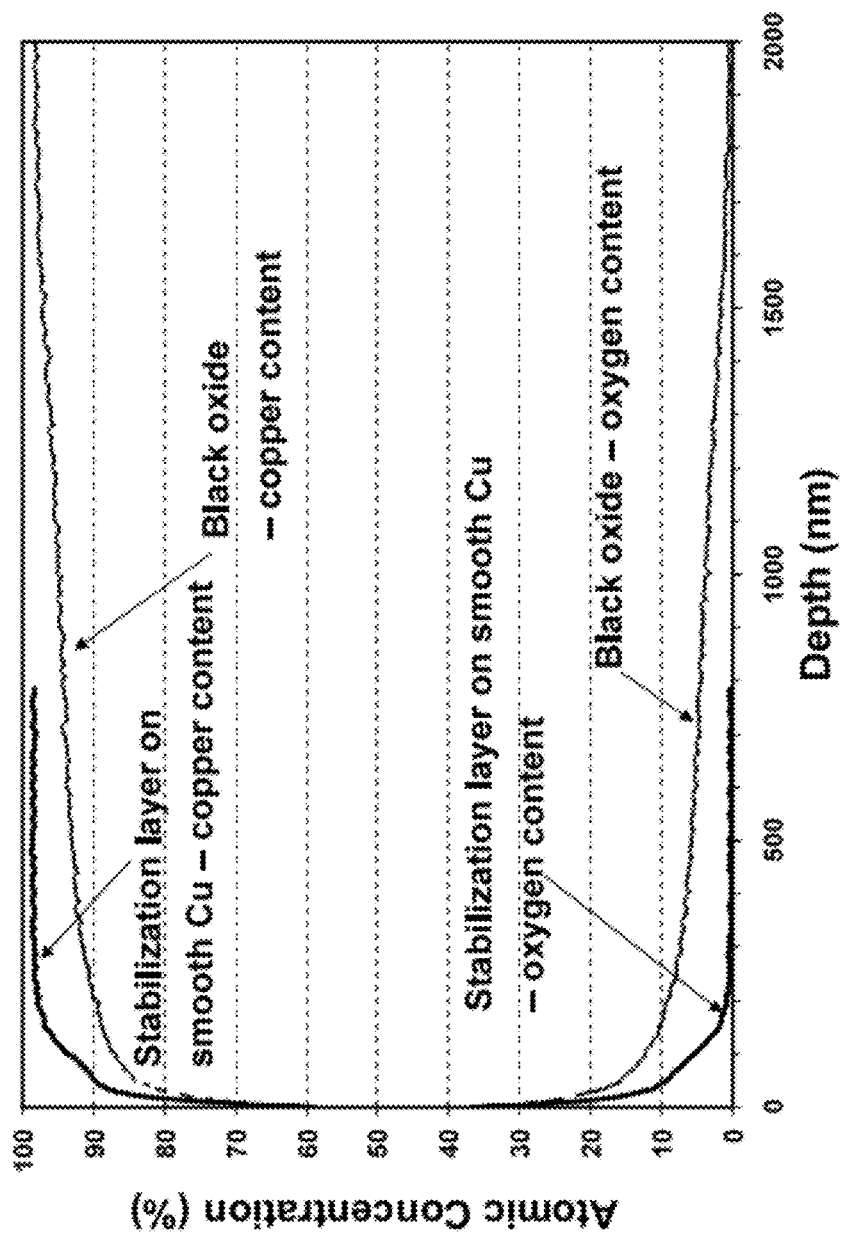
FIG. 5 graphically shows the Auger depth profile demonstrating that the treated copper layer has a thickness of less than 100 nm according to some embodiments of the present invention.

The stabilization layer of the treated smooth copper surface prepared according to Example 1 was further characterized by Auger Electron Spectroscopy (AES) to determine the surface composition and thickness distribution of the layer. Referring to FIG. 5, the AES depth profile for the treated smooth copper surface shows that the stabilization layer contains mixed copper and copper oxide, presumably cuprous oxide, and its thickness is about 100 nm. In contrast, the conventional black oxide layer extends to a distance above 1000 nm. The thickness of the stabilization layer is desired to be within a range of about 100 to 200 nm for securing good bonding strength.

Example 2

Demonstration of the Enhancement of Resin Bonding on a Smooth Copper Substrate

Figure 6:
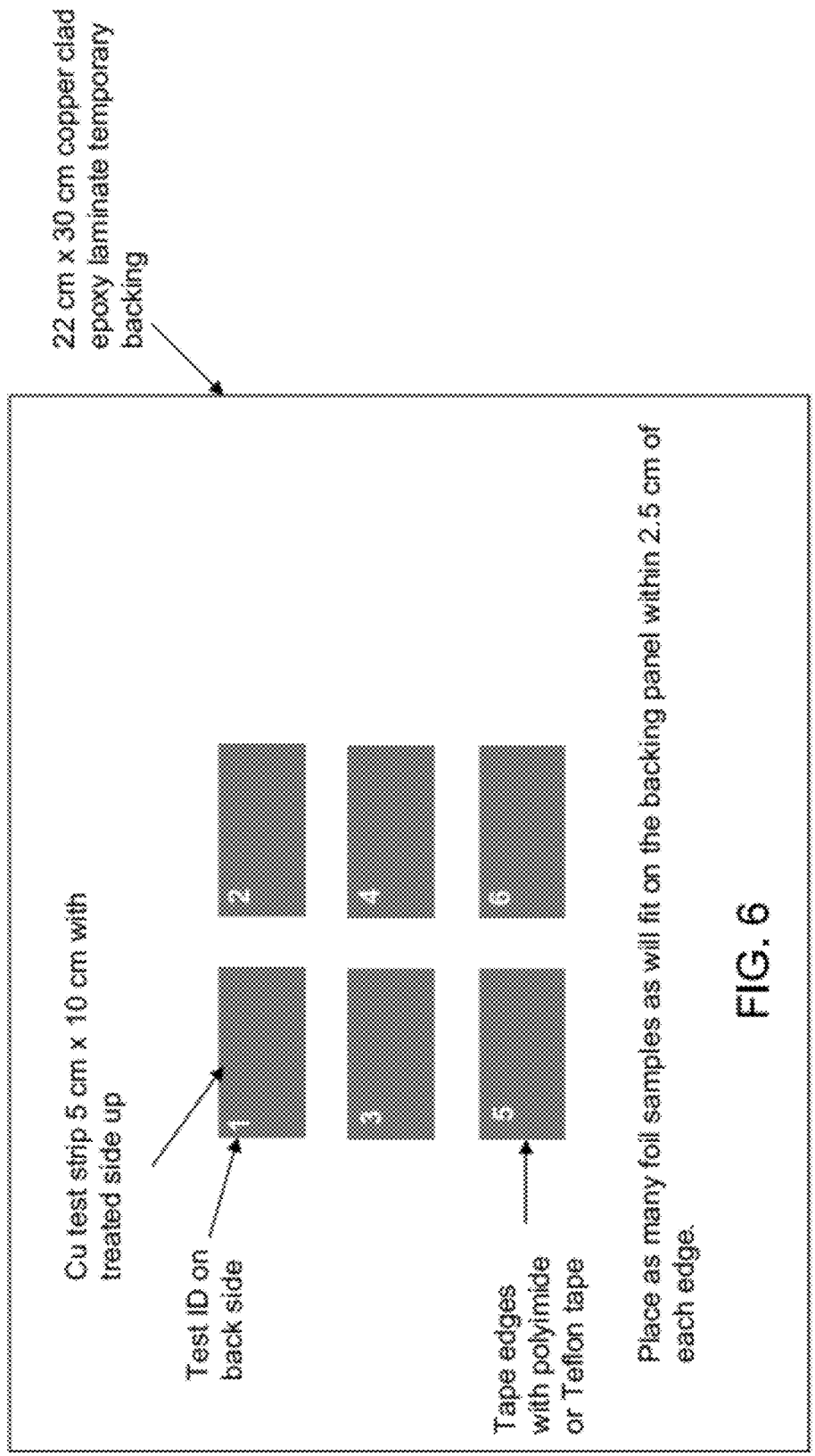
FIG. 6 is an example of a test sample layout used to conduct peel strength tests on copper test strips on an epoxy substrate.

This example illustrates one exemplary approach to enhance the adhesion of epoxy on a smooth copper substrate. The above-mentioned treated Cu test strips were laid out on a temporary backing as illustrated in FIG. 6. A commercial build-up (BU) epoxy (or dielectric) laminate film of 35 μm thickness, which had been stabilized at ambient condition for at least 3 hours, was laid on top of the Cu strips as illustrated by FIGS. 7A to 7D. The assembly was then vacuum laminated at 100° C., 30 s vacuum, and 30 s press at 3 Kg/cm². The lamination step was repeated twice to form a total of 3 plies of BU films.

It is worthy to note that the copper surface changed from reddish into a light brown or green after surface treatment, and then became black after the lamination suggesting that a chemical bonding reaction had taken place. The resin surface often contains chemically reactive groups, such as hydroxyls, amines, epoxies, and others, which can react with the oxygen rich copper surface by forming bonds.

To quantify the adhesion strength, a rigid backing substrate (stiffener) was laminated on top of the BU film as illustrated by FIG. 7B. The assembly was then heat treated or cured in a convection oven at 180° C. for 90 min.

Figures 8A, 8B:
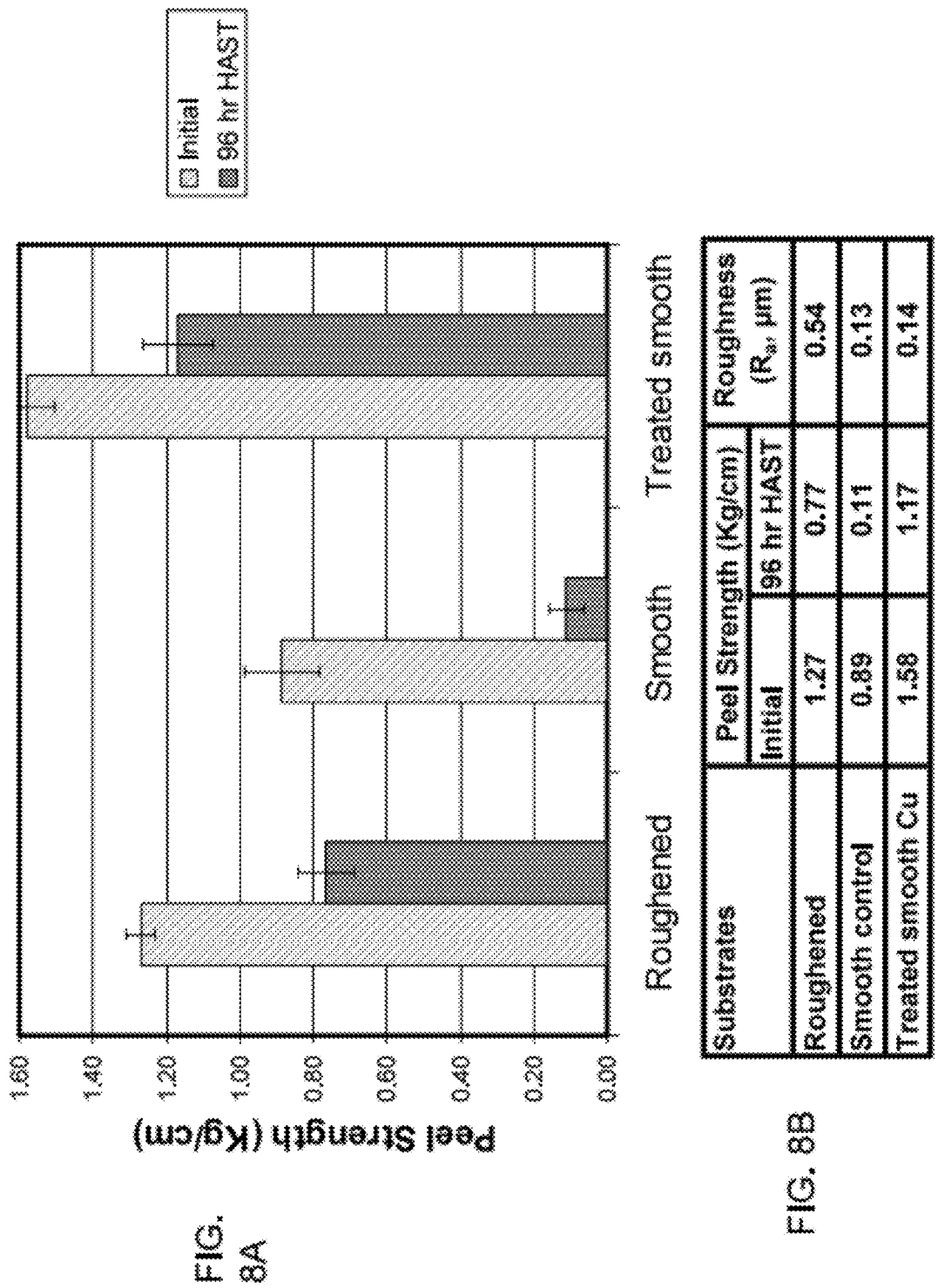
FIGS. 8A and 8B graphically illustrates peel strength and surface roughness for epoxy laminated smooth copper surfaces treated according to embodiments the present invention as compared to control substrates.

Next the assembly was diced to remove the temporary backing substrate and separate into individual test coupons for peel strength testing and testing using the highly accelerated stress test (HAST). The adhesion strength of the resulting laminate was quantified by a force gauge of a peel tester on a peel strip of 10 mm width at a 90 degree peel angle and peel speed of 50 mm/min. Specifically, peel strength was tested on the substrates as initially formed, and then after preconditioning and reflow. Preconditioning was carried out at 125° C. for 25 hours, followed by 30° C. and 60% relative humidity (RH) for 192 hours. Reflow was carried out three times at 260° C. Thereafter HAST testing was conducted at 130° C. and 85% RH for 96 hours. FIGS. 8A and 8B illustrates the impact of the treatment on the peel strength retention post HAST testing. The smooth control without (i.e. without a stabilization layer according the invention) dropped 88% in peel strength post HAST, and the conventional roughened control showed a 40% loss. In significant contrast the treated smooth copper substrate (i.e. with the stabilization layer formed according to the invention) showed not only higher initial peel strength but also a higher retention of only 11% loss. The tabular data of FIG. 8B also demonstrates that the enhancement in peel strength stability was achieved without change in the surface roughness. This result is superior, and would not have been predicted according to the teaching of the prior art.

SEM cross-sectional views of laminated treated smooth copper surface with stabilization layer as compared to a smooth control were taken and showed that methods of the present invention do not significantly roughen the copper surface.

FIGS. 9A and 9B shows a SEM cross-sectional views, pre and post HAST, of laminated treated smooth copper surface with stabilization layer formed according to embodiments of the present invention demonstrating no delamination after reflow and HAST reliability tests.

FIGS. 10A and 10B are exemplary SEM micrographs of peeled copper surfaces showing that the copper-resin interface breaks right at the copper surface for a smooth copper control (FIG. 10A), whereas the interface breaks within the resin for a treated smooth copper with stabilization layer (FIG. 10B) formed according to methods of the present invention. The surprising result demonstrates that the bonding strength between the resin and the treated copper surface of the present invention is stronger than the bonding strength of the bulk resin materials themselves.

Example 3

Demonstration of Fine Line Patterning and Electrical Isolation Reliability

Devices were formed to demonstrate that patterning of fine lines is enabled by embodiments of the present invention. Specifically, comb patterns of lines and spaces with equal dimensions (50/50, 30/30, 20/20, 10/10, and 8/8 µm) were treated and laminated following the same procedures as described in Example 1 and Example 2. SEM cross-sectional views confirmed again that the methods of the invention did not roughen the copper lines and there was no delamination after reflow and HAST tests. The electrical isolation resistance remained at above $10^{12}\Omega$ at 2 V after reflow and HAST, which is five orders of magnitude higher than that of PCB manufacturing specifications. Table 1 below summarizes the results. Good results were obtained on all of these structures, indicating that treatment of the present invention significantly improves the ability to pattern copper lines at fine line spacing, a significant advance in the art.

TABLE 1

| Fine line patterning and electrical isolation reliability | | |
|---|---|---|
| Line/Space Dimension (um) | No Delamination post HAST | Isolation Resistance post HAST × $10^{12}$ Ω at 2 V |
| 50/50 micron | Pass | 1.27 |
| 30/30 micron | Pass | 1.30 |
| 20/20 micron | Pass | 1.43 |
| 10/10 micron | Pass | 1.29 |
| 8/8 micron | Pass | 1.10 |

Example 4

Figure 11:
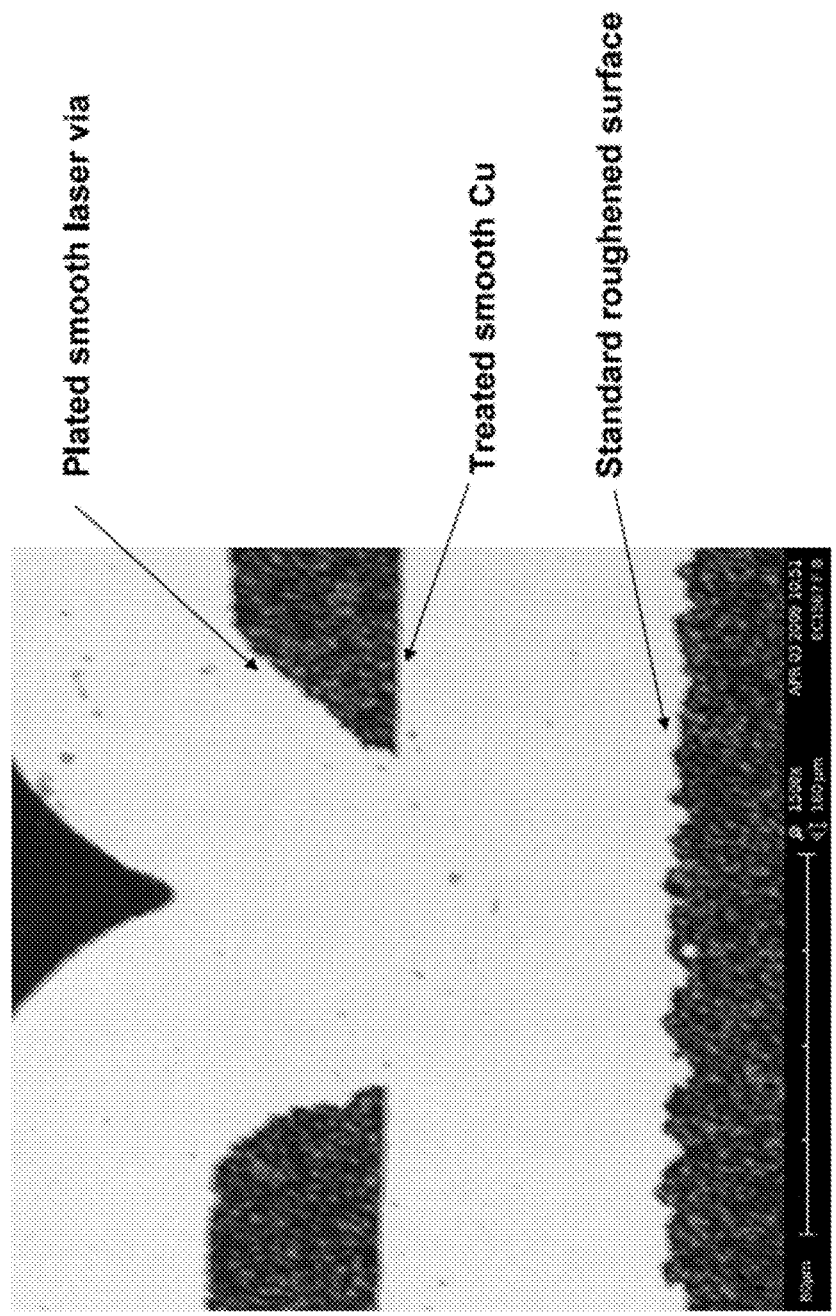
FIG. 11 shows SEM cross-section of laser via formed on laminated treated smooth copper surface demonstrating no undercutting post desmear process and plating.

Demonstration of Laser Drilling and Via Clean/Plating Compatibility of Epoxy Laminated Cu Surface Devices with laser vias were formed and then further processed to demonstrate process compatibility. Specifically, smooth copper substrates were treated and laminated following the same procedures as described in Example 1 and Example 2. Via arrays of 30, 40, 50, 75, 100, 150, and 200 µm diameter were prepared through $CO_2$ and UV laser drilling. The via structures were then subjected to a soft etch and acid clean or desmear process followed by electroless copper plating and then electroplating. FIG. 11 shows SEM cross-sections of laser vias formed on laminated smooth treated copper surfaces formed according to embodiments of the present invention demonstrating no undercutting and delamination post desmear and plating processes.

Example 5

Demonstration of the Enhancement of Solder Resist Bonding on a Smooth Copper Substrate This example illustrates one exemplary approach to enhance the adhesion of solder resist on a smooth copper substrate. The smooth copper test strips were treated following the same procedures as described in Example 1 and laid out on a temporary backing as illustrated in FIG. 6. A commercial solder resist (SR) laminate film of 30 µm thickness, which had been stabilized at ambient condition for at least 3 hours, was laid on top of the copper strips as illustrated by FIG. 7A. The assembly was then vacuum laminated at 75° C., 30 s vacuum, and 60 s press at 1 Kg/cm². The assembly was then subjected to 400 mJ/cm² UV exposure followed by curing in a convection oven at 150° C. for 60 min and post UV curing at 1000 mJ/cm².

Figures 12A, 12B:
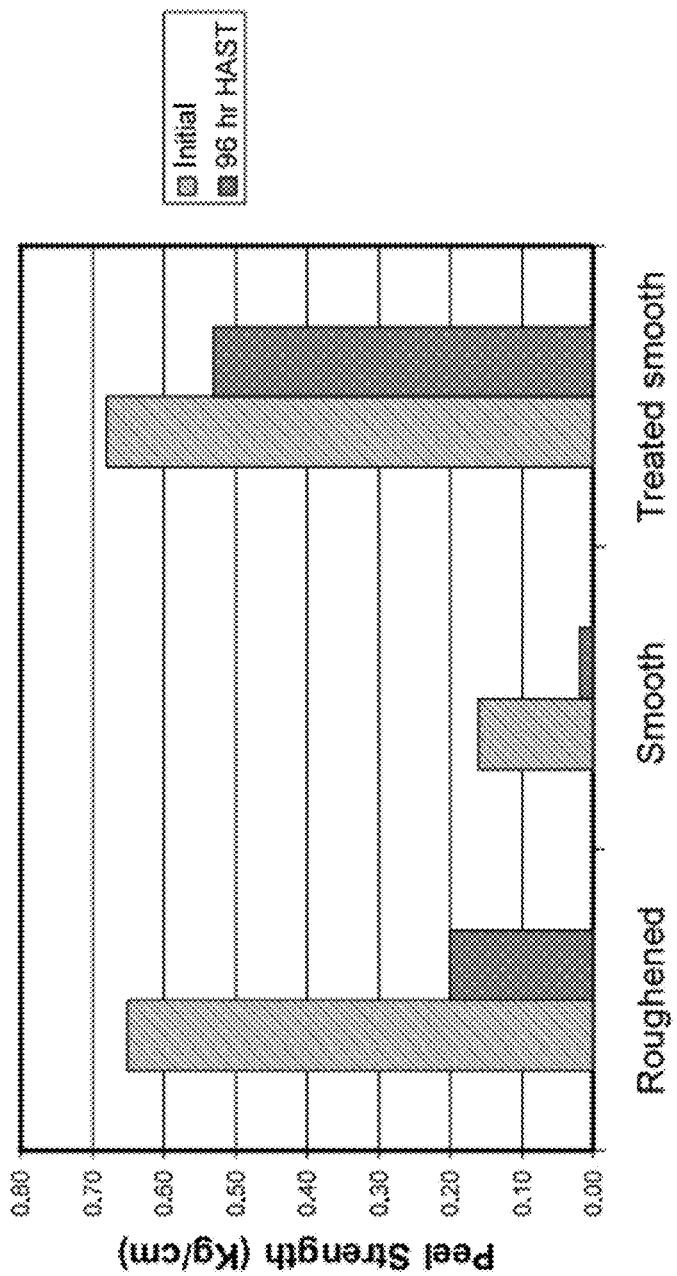
FIGS. 12A and 12B graphically illustrates peel strength and surface roughness for solder resist laminated smooth copper surface treated according to embodiments of the present invention as compared to control substrates.

To quantify the adhesion strength, a rigid backing substrate (stiffener) was laminated on top of the SR film as illustrated by FIG. 7B. The assembly was then diced to remove the temporary backing substrate and then separated into individual test coupons for peel strength testing and highly accelerated stress test (HAST) testing. Specifically, peel strength was tested on the substrates as initially formed, and then after preconditioning, reflow, and HAST. FIGS. 12A and 12B illustrate the impact of the treatment methods of the present invention on the peel strength retention post HAST testing. The smooth control without treatment dropped 87% in peel strength post HAST, and the conventional roughened control showed 69% loss. In significant contrast the treated smooth copper surface formed according to embodiments of the present invention showed not only higher initial peel strength but also a higher retention of only 22% loss. The tabular data of FIG. 12B also demonstrates that the enhancement in peel strength stability was achieved without change in surface roughness.

Example 6

Figure 13A:
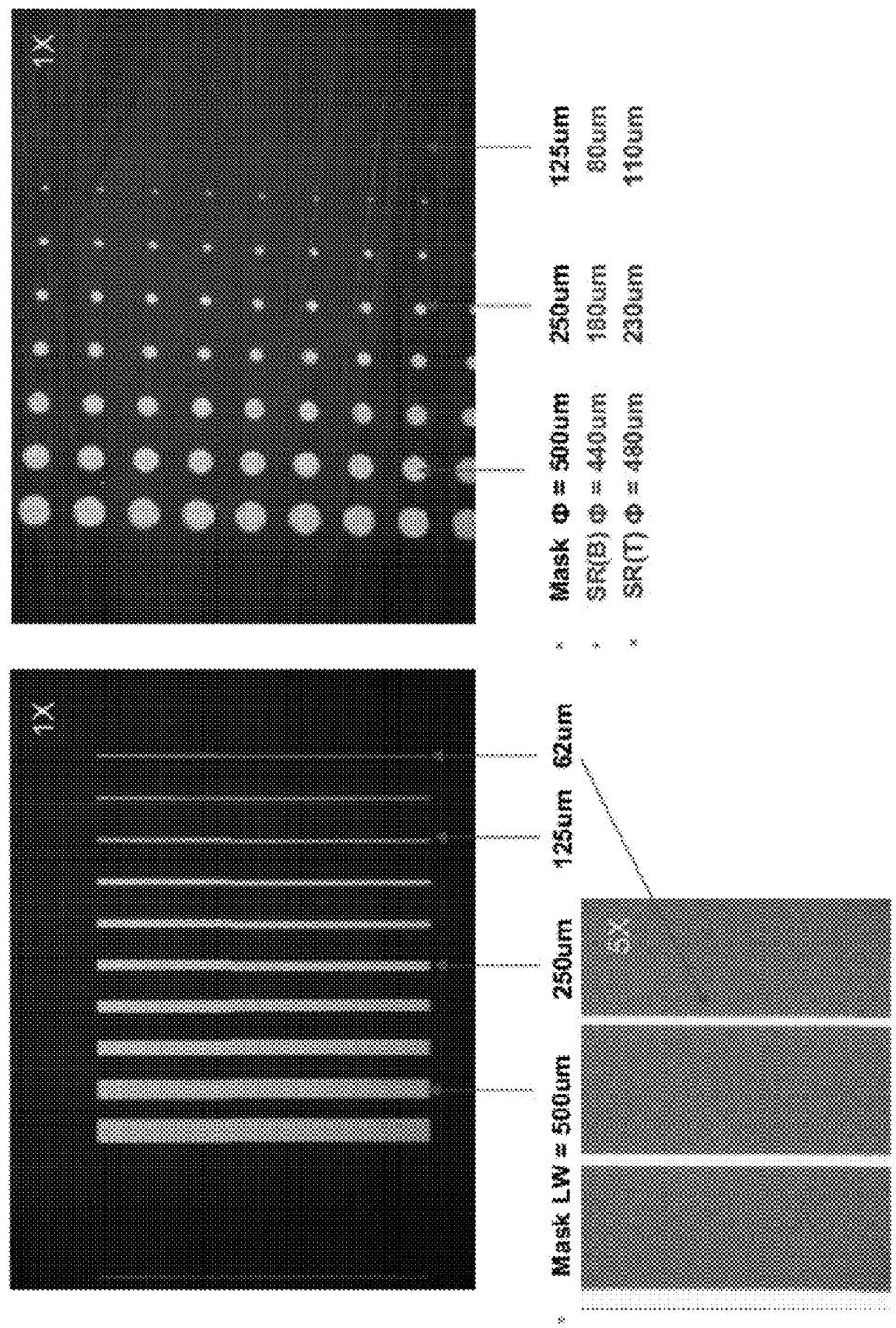
FIGS. 13A and 13B show photos of SR pattern on copper lines and via arrays (FIG. 13A) and BGA pattern (FIG. 13B)
Figure 13B:
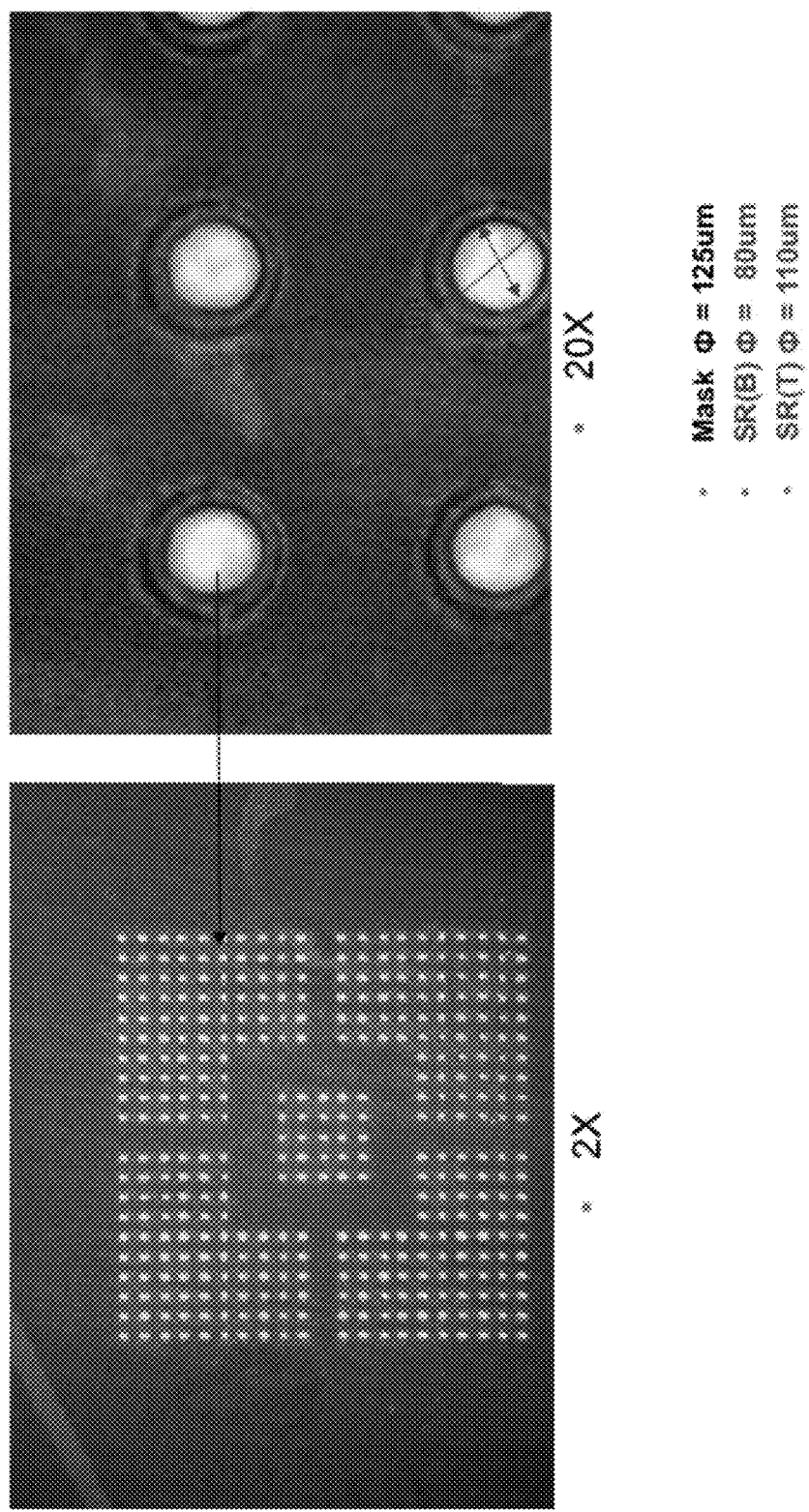
Figure 14:
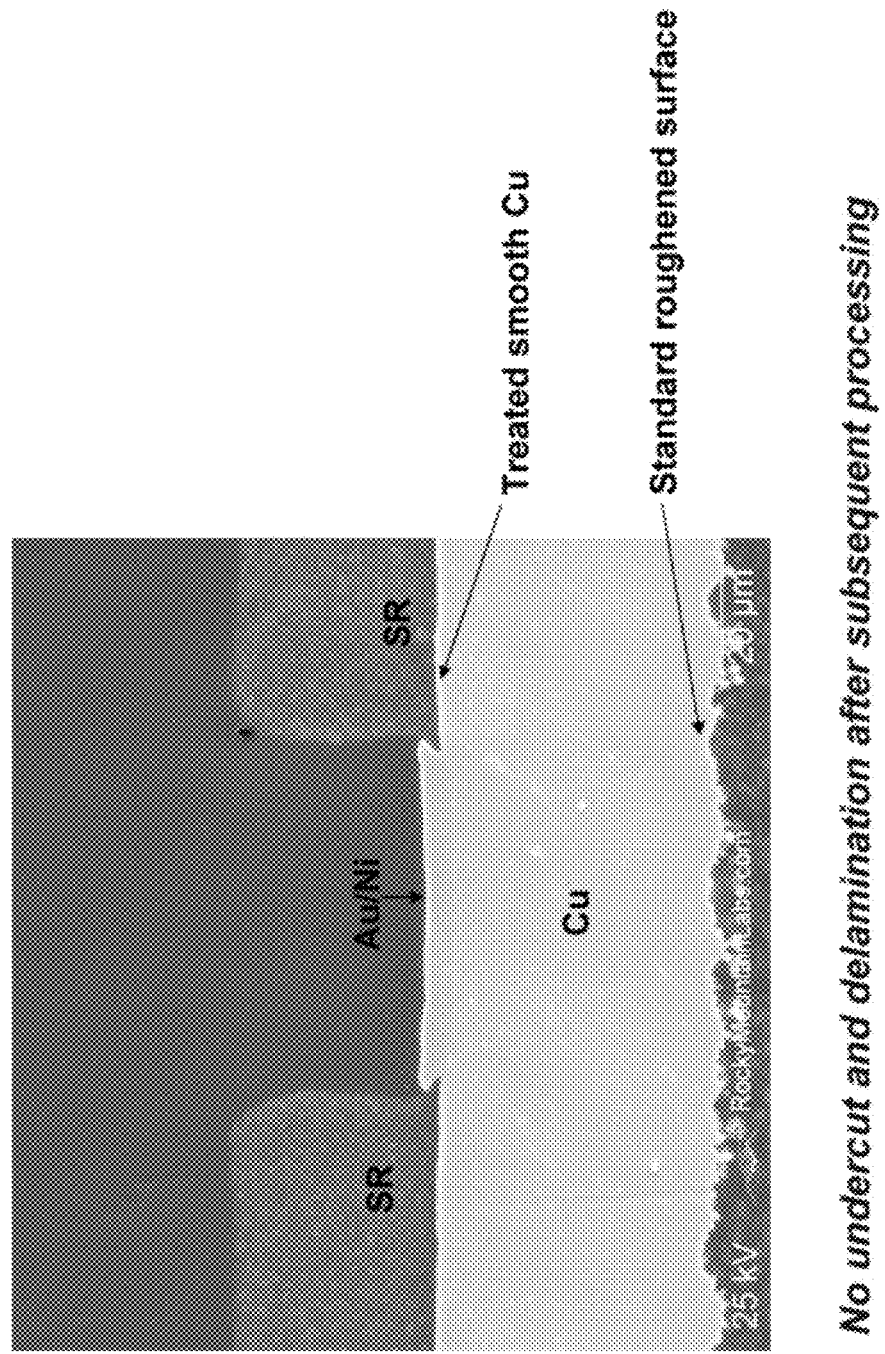
FIG. 14 shows a SEM cross-section of SR via formed on a laminated treated copper surface formed according to embodiments of the present invention and demonstrating no delamination post desmear process and plating.

Demonstration of UV Patterning and Via Clean/Plating Compatibility of SR Laminated Cu Surface Devices of via array and copper lines were formed and then further processed to demonstrate the process compatibility. Specifically, smooth copper substrates were treated and laminated following the same procedures as described in Example 5. Via arrays of bottom diameter ranging from 80 to 440 μm and copper lines of 62 to 500 μm width were formed through UV exposure and development. FIG. 13A shows the copper line pattern and via arrays, and FIG. 13B shows the ball grid array (BGA) pattern. The patterned structures were then subjected to a soft etch and an acid clean or desmear process followed by electroless Ni plating and then Au emersion deposition. FIG. 14 shows SEM cross-sections of SR vias formed on laminated smooth copper demonstrating no delamination post desmear and plating processes. Good results were obtained on all of these structures, suggesting that treatment methods of the present invention significantly improved the ability to pattern SR at fine line spacing, a significant advance in the art.

The foregoing methods, devices and description are intended to be illustrative. In view of the teachings provided herein, other approaches will be evident to those of skill in the relevant art, and such approaches are intended to fall within the scope of the present invention.

We claim:

1. A method of fabricating a printed circuit board to promote adhesion between a copper surface and an organic substrate, comprising the steps of:
stabilizing the copper surface by forming a copper oxide layer on the copper surface by exposing the copper surface to an oxidant and coupling one or more molecules to the copper oxide layer, the one or more molecules comprising a thermally stable base bearing one or more binding groups configured to bind the copper oxide layer and one or more attachment groups configured to attach to the organic substrate; and
conditioning the stabilized copper surface by reducing the copper oxide layer with a reducing agent.

2. The method of claim 1 wherein the copper oxide layer after conditioning has a thickness of about 200 nanometers or less.

3. The method of claim 1 wherein the copper oxide layer after conditioning is comprised of a substantially amorphous structure.

4. The method of claim 1 wherein the copper oxide layer has grains, and after conditioning the grains have a size of 250 nanometers or less.

5. The method of claim 1 wherein the copper oxide layer has grains, and after conditioning the grains have a size of 200 nanometers or less.

6. The method of claim 1 wherein the copper oxide has grains, and after conditioning the grains are randomly oriented.

7. The method of claim 1 wherein the oxidant is selected from the group consisting of sodium chloride, sodium hydroxide, hydrogen peroxide, permanganate, perchlorate, persulfate, ozone, and mixtures thereof.

8. The method of claim 1 wherein the reducing agent is selected from the group consisting of formaldehyde, sodium thiosulfate, sodium borohydride, a borane reducing agent represented by the general formula $BH_3NHRR'$, wherein R and R' are each selected from the group consisting of H, $CH_3$ and $CH_2CH_3$, dimethylamine borane (DMAB), a cyclic borane, morpholine borane, pyridium borane, and piperidine borane.

9. The method of claim 1 wherein stabilizing the copper surface is carried out at a temperature in the range of room temperature to about 80° C.

10. The method of claim 1 wherein conditioning the copper oxide layer is carried out at a temperature in the range of room temperature to about 50° C.

11. The method of claim 1 wherein the method is carried out for a time in the range of about 2 to 20 minutes.

12. The method of claim 1 wherein the one or more molecules is a surface active moiety.

13. The method of claim 12 wherein said surface active moiety is selected from the group consisting of a macrocyclic proligand, a macrocyclic complex, a sandwich coordination complex and polymers thereof.

14. The method of claim 12 wherein said surface active moiety is a porphyrin.

15. The method of claim 1 wherein the one or more molecules is selected from the group consisting of a porphyrin, a porphyrinic macrocycle, an expanded porphyrin, a contracted porphyrin, a linear porphyrin polymer, a porphyrinic sandwich coordination complex, and a porphyrin array.

16. The method of claim 1 wherein the one or more attachment group is comprised of an aryl functional group and/or an alkyl attachment group.

17. The method of claim 16 wherein the aryl functional group is comprises a functional group selected from the group consisting of acetate, alkylamino, allyl, amine, amino, bromo, bromomethyl, carbonyl, carboxylate, carboxylic acid, dihydroxyphosphoryl, epoxide, ester, ether, ethynyl, formyl, hydroxy, hydroxymethyl, iodo, mercapto, mercaptomethyl, Se-acetylseleno, Se-acetylselenomethyl, S-acetylthio, S-acetylthiomethyl, selenyl, 4,4,5,5-tetramethyl-1,3,2-dioxaborolan-2-yl, 2-(trimethylsilyl)ethynyl, vinyl, and combinations thereof.

18. The method of claim 16 wherein the alkyl attachment group comprises a functional group selected from the group consisting of acetate, alkylamino, allyl, amine, amino, bromo, bromomethyl, carbonyl, carboxylate, carboxylic acid, dihydroxyphosphoryl, epoxide, ester, ether, ethynyl, formyl, hydroxy, hydroxymethyl, iodo, mercapto, mercaptomethyl, Se-acetylseleno, Se-acetylselenomethyl, S-acetylthio, S-acetylthiomethyl, selenyl, 4,4,5,5-tetramethyl-1,3,2-dioxaborolan-2-yl, 2-(trimethylsilyl)ethynyl, vinyl, and combinations thereof.

19. The method of claim 1 wherein the one or more attachment groups comprises an alcohol or a phosphonate.

20. The method of claim 1 wherein the one or more attachment groups is selected from the group consisting of amines, alcohols, ethers, other nucleophile, phenyl ethynes, phenyl allylic groups, phosphonates and combinations thereof.

21. The method of claim 1 wherein the one or more molecules is selected from the group consisting of a porphyrin, a porphyrinic macrocycle, an expanded porphyrin, a contracted porphyrin, a linear porphyrin polymer, a porphyrinic sandwich coordination complex, a porphyrin array, a silane, a tetraorgano-silane, aminoethyl-aminopropyl-trimethoxysilane, (3-Aminopropyl)trimethoxysilane, (1-[3-(Trimethoxysilyl)propyl]urea), (3-Aminopropyl) triethoxysilane, ((3-Glycidyloxypropyl)trimethoxysilane), (3-Chloropropyl) trimethoxysilane, (3-Glycidyloxypropyl)trimethoxysilane, Dimethyldichlorosilane, 3-(Trimethoxysilyl)propyl methacrylate, Ethyltriacetoxysilane, Triethoxy(isobutyl)silane, Triethoxy(octyl)silane, Tris(2-methoxyethoxy)(vinyl)silane, Chlorotrimethylsilane, Methyltrichlorosilane, Silicon tetrachloride, Tetraethoxysilane, Phenyltrimethoxysilane, Chlorotriethoxysilane, ethylene-trimethoxysilane, an amine, a sugar, and any combination thereof.

22. The method of claim 1 wherein the one or more molecules is selected from the group consisting of molybdates, tungstates, tantalates, niobates, vanadates, isopoly or heteropoly acids of molybdenum, tungsten, tantalum, niobium, vanadium, and any combination thereof.

* * * * *